(12) United States Patent
Cho et al.

(10) Patent No.: US 9,824,771 B2
(45) Date of Patent: Nov. 21, 2017

(54) GATE SHIFT REGISTER AND DISPLAY DEVICE USING THE SAME

(71) Applicant: LG DISPLAY CO., LTD., Seoul (KR)

(72) Inventors: Sunghyun Cho, Seoul (KR); Chungsik Kong, Paju-si (KR); Sungwook Chang, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 195 days.

(21) Appl. No.: 14/133,243

(22) Filed: Dec. 18, 2013

(65) Prior Publication Data

US 2014/0321599 A1  Oct. 30, 2014

(30) Foreign Application Priority Data

Apr. 30, 2013 (KR) ........................ 10-2013-0048387

(51) Int. Cl.
*G11C 19/00* (2006.01)
*G11C 19/28* (2006.01)

(52) U.S. Cl.
CPC ..... *G11C 19/28* (2013.01); *G09G 2310/0286* (2013.01)

(58) Field of Classification Search
None
See application file for complete search history.

(56) References Cited

U.S. PATENT DOCUMENTS

| 7,778,379 | B2* | 8/2010 | Liao et al. | 377/64 |
| 8,331,524 | B2* | 12/2012 | Hsu et al. | 377/64 |
| 8,587,508 | B2* | 11/2013 | Iwase | G09G 3/3677 345/100 |
| 8,633,888 | B2* | 1/2014 | Kim et al. | 345/100 |
| 2003/0231735 | A1* | 12/2003 | Moon et al. | 377/64 |
| 2006/0269038 | A1* | 11/2006 | Jang et al. | 377/64 |
| 2007/0104307 | A1* | 5/2007 | Kim et al. | 377/64 |
| 2008/0101529 | A1* | 5/2008 | Tobita | G09G 3/3677 377/64 |
| 2008/0219401 | A1* | 9/2008 | Tobita | G09G 3/3677 377/79 |
| 2009/0167668 | A1* | 7/2009 | Kim | 345/100 |

FOREIGN PATENT DOCUMENTS

| CN | 1705042 A | 12/2005 |
| CN | 101399086 A | 4/2009 |
| JP | 2010-250030 | * 11/2010 |

OTHER PUBLICATIONS

Office Action of the Chinese Patent Office in the application No. 201310718167.7; dated Apr. 5, 2016.*

* cited by examiner

Primary Examiner — Tuan T Lam
(74) Attorney, Agent, or Firm — Dentons US LLP

(57) ABSTRACT

Provided is a gate shift register including a plurality of stages receiving a plurality of clocks to generate gate output signals, in which an n-th stage of the stages dependently connected to each other includes an output node outputting an n-th gate output signal, a pull-up TFT switching a current flow between an input terminal of a clock having an n-th phase and the output node according to a potential of a Q node, a pull-down TFT switching the current flow between an input terminal of a low potential voltage and the output node according to a potential of a QB node, appnd a BTS compensation unit periodically discharging the QB node at a low potential level just after the n-th stage is reset and just until the n-th stage is set in a next frame.

8 Claims, 21 Drawing Sheets

GATE SHIFT REGISTER AND DISPLAY DEVICE USING THE SAME

CROSS-REFERENCE TO RELATED APPLICATIONS

This application claims the benefit of Korea Patent Application No. 10-2013-0048387 filed on Apr. 30, 2013, which is incorporated herein by reference for all purposes as if fully set forth herein.

BACKGROUND OF THE INVENTION

Field of the Invention

The present invention relates to a gate shift register and a display device using the same.

Discussion of the Related Art

Recently, various flat panel displays (FPD) have been developed and entered the market. Generally, a scan driving circuit of the flat panel display sequentially supplies scan pulses to scan lines by using a gate shift register.

The gate shift register of the scan driving circuit is provided with stages including a plurality of thin film transistors (hereinafter, referred to as "TFT"). The stages are dependently connected (cascade) to sequentially generate outputs.

Each of the stages includes a Q node controlling a pull-up TFT (pull-up thin film transistor) and a Q bar (QB) node controlling a pull-down TFT (pull-down thin film transistor). Further, each of the stages includes switch TFTs oppositely charging and discharging voltages of the Q node and the QB node in response to a start signal inputted from an anterior stage, a reset signal inputted from a posterior stage, and a clock signal.

Each stage is operated by driving timing similar to FIG. 1. Referring to FIG. 1, the stage responds to the start signal to charge the Q node, and then bootstraps a potential of the Q node when the clock signal CLK is inputted to turn-on the pull-up transistor. Accordingly, the clock signal CLK is outputted as a gate output signal Vg. Subsequently, the stage responds to the reset signal to reduce the potential of the Q node from a charging level (for example, high potential level) to a discharging level (for example, low potential level) and then maintain the potential of the Q node at the low potential level during approximately one frame period.

The QB node is charged and discharged on the contrary to the Q node. That is, when the Q node has the high potential level, the QB node has the low potential level VL. When the Q node is maintained at the low potential level, the QB node is maintained at the high potential level VH. The QB node is maintained at the high potential level VH for most of one frame. Accordingly, positive bias stress (hereinafter, referred to as "PBTS") is built up in gate electrodes of the TFTs (pull-down TFT and some switch TFTs) switched according to the potential of the QB node. The PBTS is increased in proportion to the elapse of driving time to degrade the corresponding TFTs. A threshold voltage of the TFTs is shifted in a positive (+) direction in proportion to a quantity of built PBTS. On the contrary, the threshold voltage of the TFTs is shifted in a negative (−) direction in proportion to a quantity of built NBTS (negative bias stress). Meanwhile, an a-Si:H TFT including a semiconductor layer made of an amorphous silicon material and a poly TFT including a semiconductor layer made of a polysilicon material are known as the TFT. Currently, an oxide TFT having various advantages such as a yield and process easiness is frequently used. The oxide TFT includes a metal oxide semiconductor layer to have electron mobility that is 20 to 30 times higher than that of the a-Si:H TFT.

In the scan driving circuit using the a-Si:H TFT, as shown in FIG. 2, two pull-down TFTs Tpd1 and Tpd2 connected two QB nodes QB1 and QB2, respectively, are alternately driven to reduce a degradation of the TFTs and improve reliability of the circuit. However, in the scan driving circuit using the oxide TFT, even though the structure of FIG. 2 is applied, reliability of the circuit is not improved. The reason is because the oxide TFT has a very small negative (−) shift quantity of the threshold voltage as compared to the a-Si:H TFT in a state of NBTS during an idle driving period and thus it is difficult for the threshold voltage shift caused by PBTS to be recovered to an original state.

A BTS (bias stress) characteristic of the oxide TFT is better than that of the a-Si:H TFT. However, the oxide TFT is poor in terms of a recovery characteristic by alternate driving. Accordingly, reliability of the scan driving circuit is reduced. When FIG. 2 is constituted by using the a-Si:H TFT, as shown in FIG. 3a, even though the driving time elapses, the threshold voltage of the TFTs is maintained at a constant value (clamping voltage saturation). On the contrary, when FIG. 2 is constituted by using the oxide TFT, as shown in FIG. 3b, the threshold voltage of the TFTs is shifted in the positive (+) direction according to the elapse of driving time (clamping voltage not saturation).

SUMMARY OF THE INVENTION

The present invention has been made in an effort to provide a gate shift register reducing gate bias stress of TFTs switched according to a potential of a QB node to increase a life-span of a scan driving circuit, and a display device using the same.

An exemplary embodiment of the present invention provides a gate shift register including a plurality of stages receiving a plurality of clocks where phases are sequentially shifted to generate gate output signals. An n-th stage of the stages dependently connected to each other may include a first output node outputting an n-th gate output signal of the gate output signals. A first pull-up TFT switches a current flow between an input terminal of a clock having an n-th phase among the clocks and the first output node according to a potential of a first Q node. A 1-1-th pull-down TFT switches the current flow between an input terminal of a low potential voltage and the first output node according to a potential of a first QB node charged and discharged differently from the first Q node. A 1-1-th switch TFT charges the first Q node at a high potential level by connecting the input terminal of a first high potential voltage to the first Q node according to a first start signal having a phase leading a phase of the n-th gate output signal. A 2-1-th switch TFT discharges the first QB node at a low potential level according to the potential of the first Q node. A 3-1-th switch TFT discharges the first Q node at a low potential level according to a reset signal having a phase lagging behind a phase of the n-th gate output signal. A 4-1-th switch TFT discharges the first Q node at the low potential level according to the potential of the first QB node. A first BTS compensation unit periodically discharges the first QB node at the low potential level just after the n-th stage is reset and just until the n-th stage is set in a next frame.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
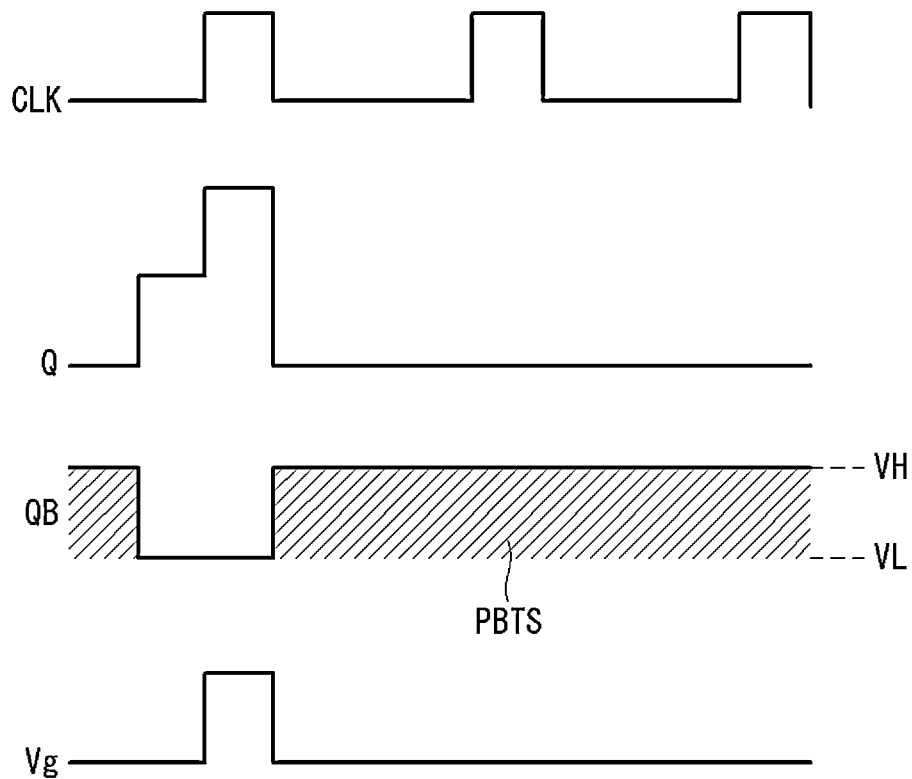
FIG. 1 is a general driving timing view of a unit stage constituting a gate shift register.
Figure 2:
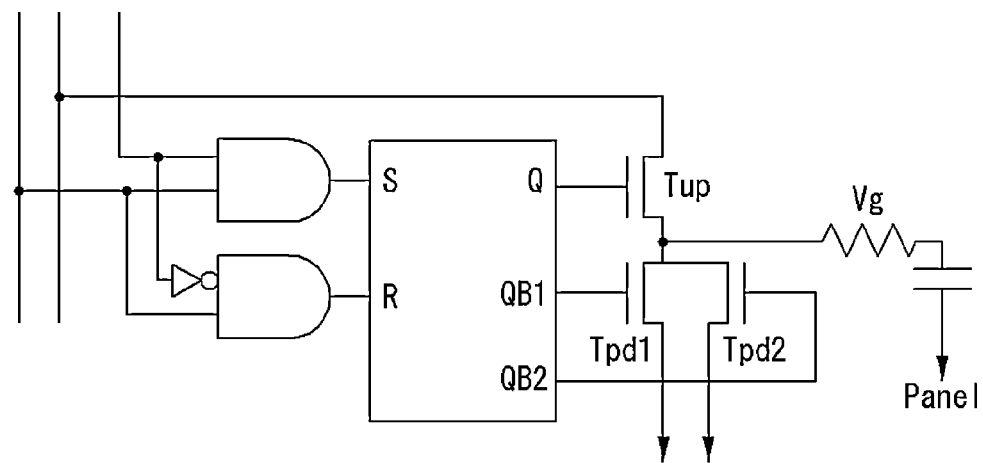
FIG. 2 is a view schematically showing a known stage structure where two QB nodes are alternately driven.
Figure 3A:
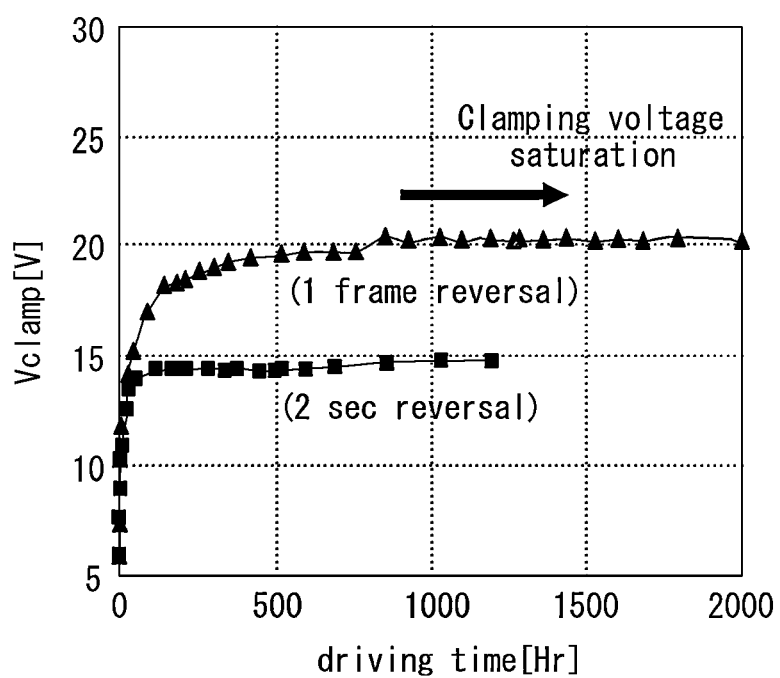
FIG. 3A is a view showing a reliability characteristic of a scan driving circuit using an a-Si:H TFT.
Figure 3B:
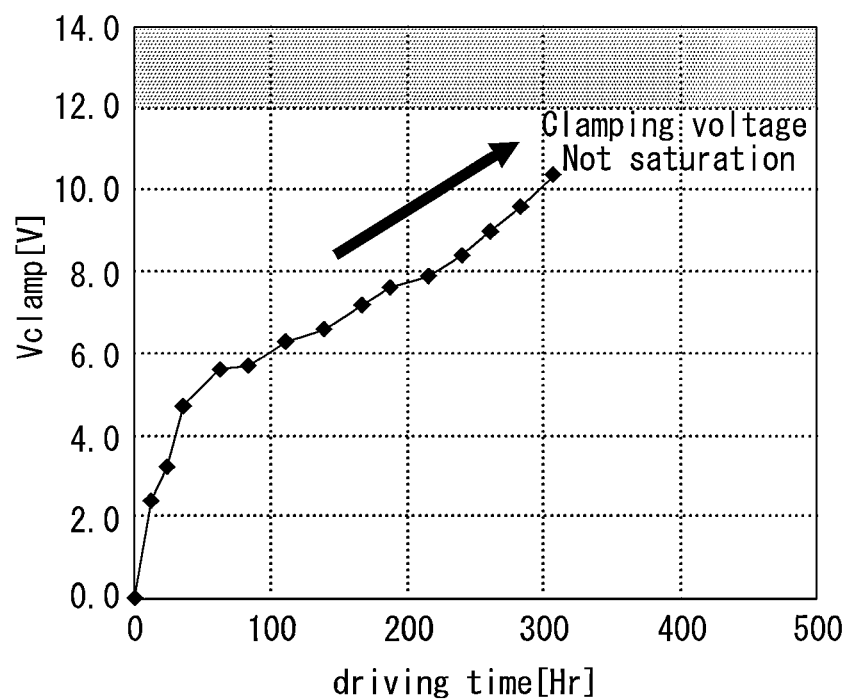
FIG. 3B a scan driving circuit using an oxide TFT.

Hereinafter, exemplary embodiments of the present invention will be described in detail with reference to the accompanying drawings. Throughout the specification, like reference numerals denote substantially like components. In the following description, if it is decided that the detailed description of known function or configuration related to the invention makes the subject matter of the invention unclear, the detailed description is omitted. The names of the components used in the following description are selected in consideration of easiness of specification writing and may be different from those of actual products. In the following description, the term "anterior stages" means stages positioned at an upper portion of a stage as a reference to generate gate output signals having a phase leading those of reference gate output signals outputted from a reference stage. In addition, the term "posterior stages" means stages positioned at a lower portion of the stage as the reference to generate the gate output signals having the phase lagging behind those of the reference gate output signals outputted from the reference stage. In the following description, it is preferable that TFTs constituting a gate shift register of the present invention be embodied by an oxide TFT. However, a technical spirit of the present invention is not limited thereto, and may be naturally applied to an a-Si:H TFT and a poly TFT of an LTPS process.

Figure 4:
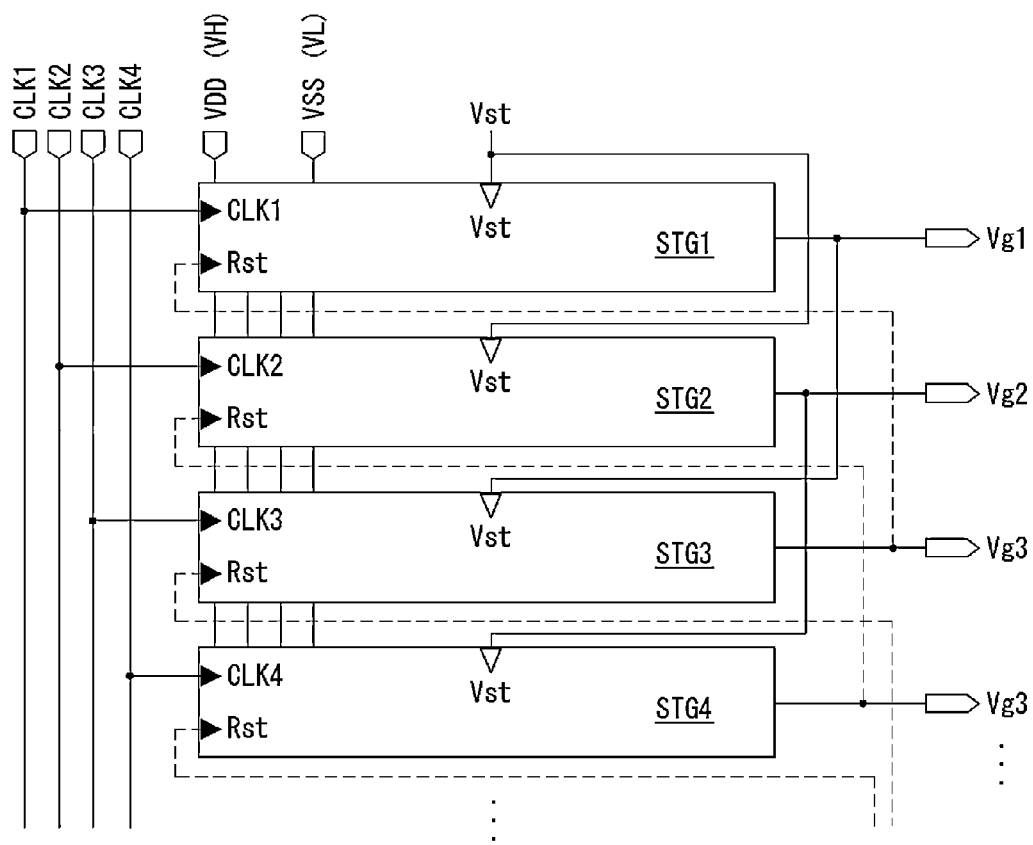
FIG. 4 illustrates a gate shift register according to an exemplary embodiment of the present invention.

FIG. 4 schematically shows a constitution of a gate shift register according to an exemplary embodiment of the present invention.

Referring to FIG. 4, the gate shift register according to the exemplary embodiment of the present invention is provided with a plurality of stages STG1 to STG4, . . . which are dependently connected.

Each of the stages STG1 to STG4 is provided with an output channel to generate gate output signals Vg1 to Vg4, . . . . Phases of the gate output signals Vg1 to Vg4, . . . are sequentially shifted. Each of the gate output signals Vg1 to Vg4, . . . may be applied as a scan pulse to scan lines of a display device and as a start signal Vst to any one of the posterior stages. Further, the gate output signal may be inputted as a reset signal Rst to any one of the anterior stages.

An operation of each of the stages STG1 to STG4, . . . is set according to the start signal Vst applied to a start terminal every frame. A Q node of each of the stages STG1 to STG4, . . . is charged and a QB node is discharged by a setting operation. A gate start pulse may be applied as the start signal Vst from an external timing controller to two stages STG1 and STG2 at uppermost ends. In addition, the gate output signal of a pre-anterior stage may be applied as the start signal Vst to each of the stages STG3,STG4, . . . other than the two stages STG1 and STG2 at the uppermost ends. For example, the gate output signal Vgk−2 of the k−2-th stage STGk−2 may be applied as the start signal Vst to the k-th (k is a natural number) stage STGk.

The operation of each of the stages STG1 to STG4, . . . is reset according to the reset signal Rst applied to a reset terminal every frame. The Q node of each of the stages STG1 to STG4, . . . is discharged and the QB node is charged by a resetting operation. The gate output signal of a post-posterior stage may be applied as the reset signal Rst to each of the stages STG1 to STG4, . . . . For example, the gate output signal Vgk+2 of the k+2-th stage STGk+2 may be applied as the reset signal Rst to the k-th stage STGk.

Any one of i-phase (i is a positive even number) gate shift clocks overlapping for a predetermined time, in which phases are sequentially delayed, may be inputted to each of the stages STG1 to STG4, . . . . It is preferable that the gate shift clocks be embodied to have four or more phases in order to secure a sufficient charging time during driving at high speeds. The following exemplary embodiments including the present exemplary embodiment describes that the gate shift clocks have four phases, but the technical spirit of the present invention is not limited thereto. The gate output signals Vg1 to Vg4, . . . are sequentially shifted to be synchronized with four-phase gate shift clocks CLK1 to CLK4 where phases are sequentially delayed. The four-phase gate shift clocks CLK1 to CLK4 swing between a gate high voltage and a gate low voltage.

A high potential voltage VDD of a high potential level VH and a low potential voltage VSS of a low potential level VL that is lower than the high potential level VH are supplied to each of the stages STG1 to STG4, . . . . The high potential level VH may be set to be substantially the same as the gate high voltage. The low potential level VL may be set to be substantially the same as the gate low voltage.

Figure 5:
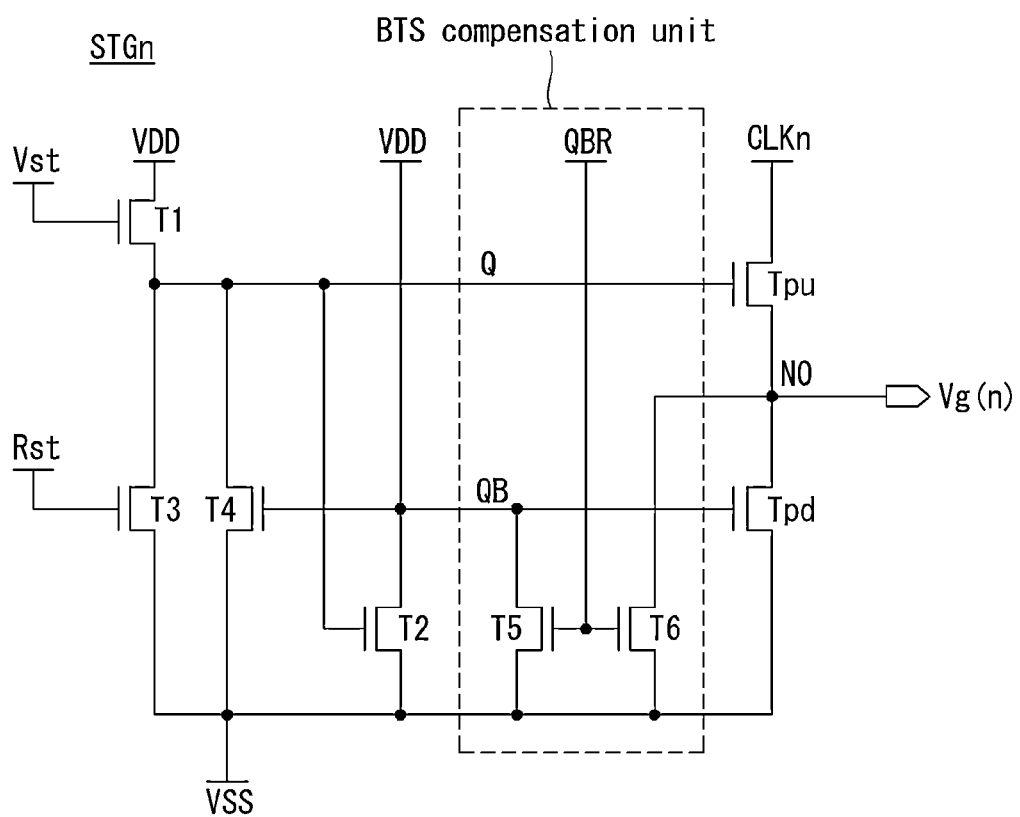
FIG. 5 illustrates an n-th stage of stages shown in FIG. 4.
Figure 7:
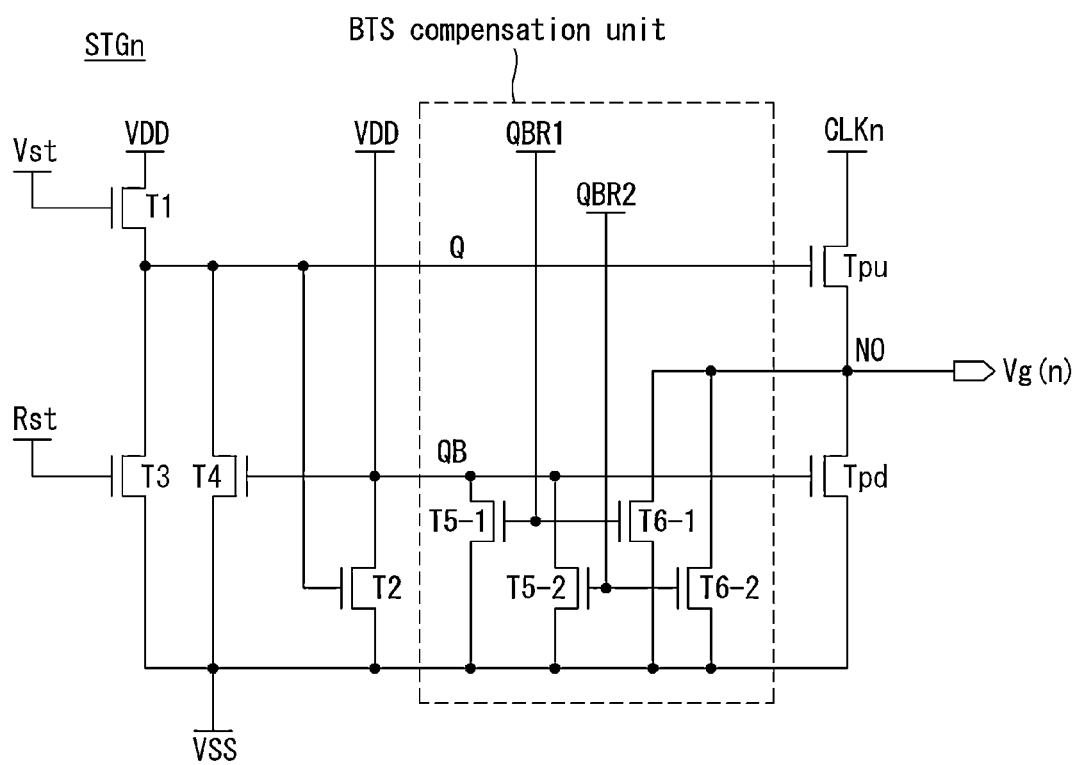
FIG. 7 is a view showing another embodiment of the n-th stage of the stages shown in FIG. 4.
Figure 9:
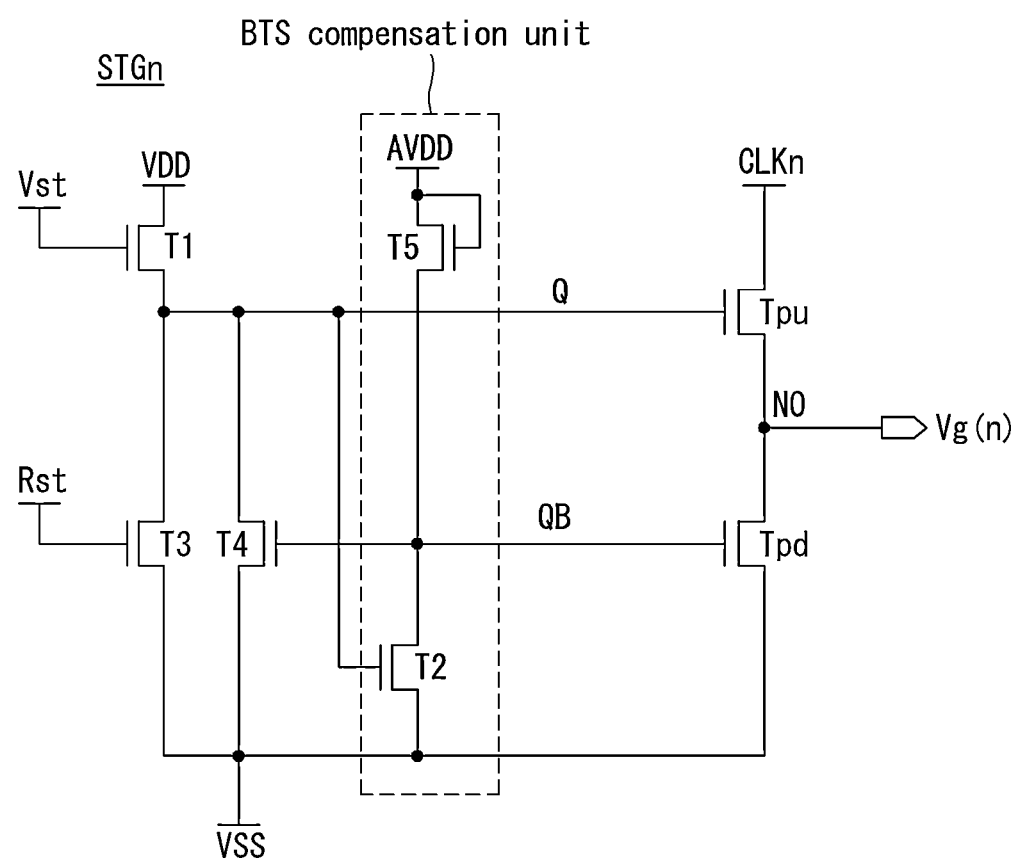
FIG. 9 is a view showing another embodiment of the n-th stage of the stages shown in FIG. 4.

Particularly, each of the stages STG1 to STG4, . . . includes a BTS compensation unit shown in FIGS. 5, 7, and 9 to periodically discharge the QB node.

Accordingly, gate bias stress of the TFTs switched according to a potential of the QB node is reduced. In each of the stages STG1 to STG4, . . . , the BTS compensation unit periodically discharges the QB node just after the corresponding stage is reset and just until the corresponding stage is set in a next frame. The BTS compensation unit may receive at least one discharging control signal (QBR of FIG. 5 or QBR1 and QBR2 of FIG. 7) to perform a periodic discharging operation. The discharging control signal may be selected as any one of the four-phase clocks CLK1 to CLK4 shown in FIG. 6, or as any one of separate four-phase auxiliary clocks ACLK1 to ACLK4 shown in FIG. 8. Meanwhile, the BTS compensation unit may receive an alternating current high potential voltage AVDD shown in FIG. 9 in order to perform the periodic discharging operation. The alternating current high potential voltage AVDD swings at the high potential level VH and the low potential level VL, and is reduced to the low potential level VL every predetermined cycle.

Figure 6:
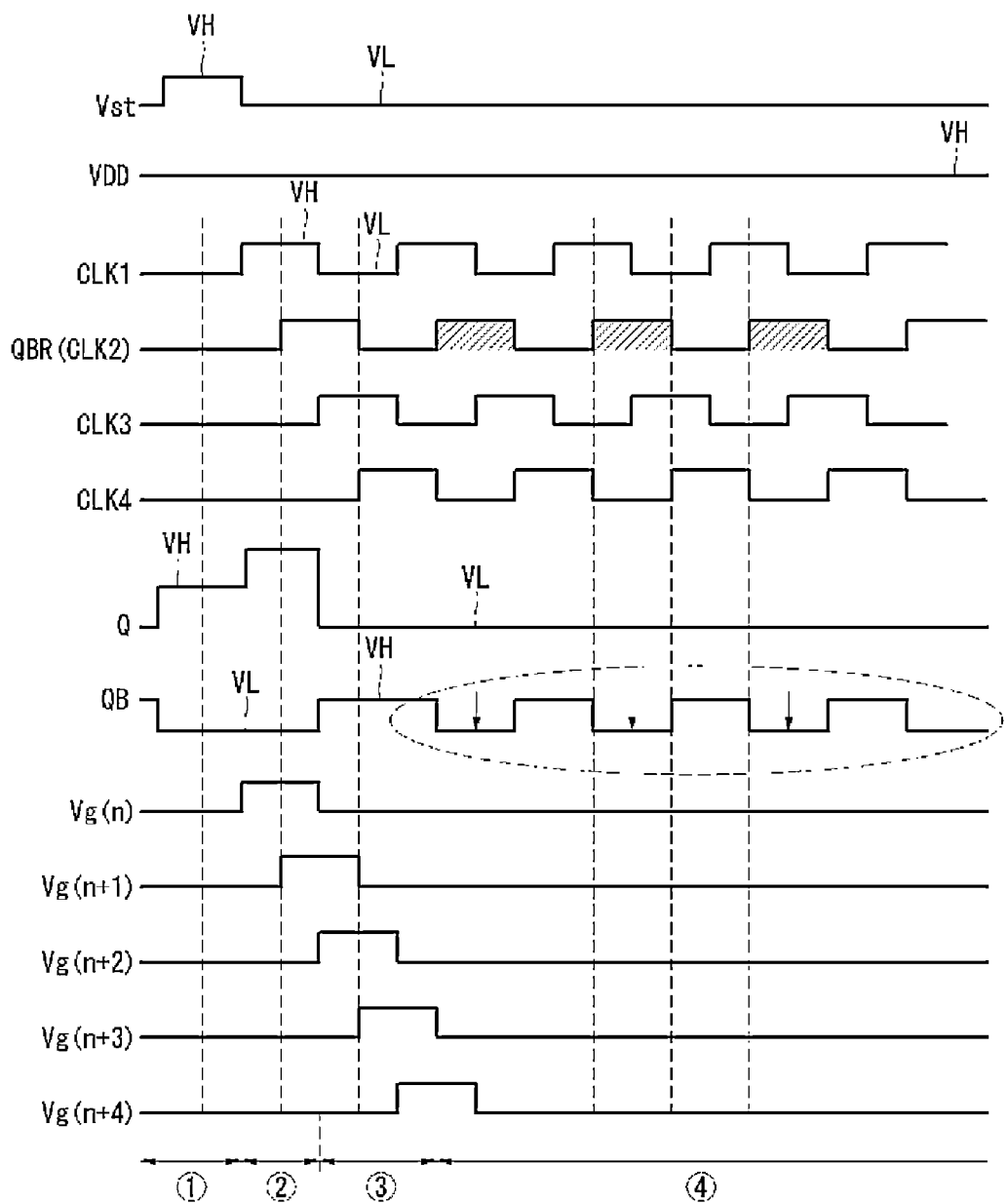
FIG. 6 is a view showing an operation waveform of the n-th stage shown in FIG. 5.

FIG. 5 shows a constitution of an n-th (n is a positive integer) stage STGn of the stages STG1 to STG4, . . . shown in FIG. 4. In addition, FIG. 6 shows an operation waveform of the n-th stage STGn shown in FIG. 5.

Referring to FIG. 5, the n-th stage STGn is provided with an output node NO outputting an n-th gate output signal Vg(n), a pull-up TFT (Tpu) switched according to the potential of the Q node, a pull-down TFT (Tpd) switched according to the potential of the QB node, first, third, and fourth switch TFTs T1, T3, and T4 charging and discharging the Q node, a second switch TFT T2 discharging the QB node according to the potential of the Q node, and a BTS compensation unit reducing gate bias stress of the TFTs Tpd and T4 periodically discharging the QB node according to the discharging control signal QBR to be switched according to the potential of the QB node.

The pull-up TFT Tpu switches a current flow between an input terminal of a clock CLKn having an n-th phase and the output node NO according to the potential of the Q node. When the clock CLKn having the n-th phase is inputted while the Q node is charged at the high potential level VH, the potential of the Q node is bootstrapped to a voltage that is higher than the high potential level VH to turn-on the pull-up TFT Tpu. When the pull-up TFT Tpu is turned-on, the clock CLKn having the n-th phase, that is, a first clock CLK1 in an example of FIG. 6, is applied to the output node NO.

The pull-down TFT Tpd switches the current flow between the input terminal of the low potential voltage VSS and the output node NO according to the potential of the QB node charged and discharged differently from the Q node. When the pull-down TFT Tpd is turned-on, the low potential voltage VSS is applied to the output node NO.

The first, third, and fourth switch TFTs T1, T3, and T4 relate to charging and discharging of the Q node. The first switch TFT T1 charges the Q node at the high potential level VH by connecting the input terminal of the high potential voltage VDD to the Q node according to the start signal Vst having the phase leading the phase of the n-th gate output signal Vg(n). Herein, as described above, the start signal Vst may be selected as an n–2-th gate output signal Vg(n–2). The third switch TFT T3 discharges the Q node at the low potential level VL by connecting the Q node to the input terminal of the low potential voltage VSS according to the reset signal Rst having the phase lagging behind the phase of the n-th gate output signal Vg(n). Herein, as described above, the reset signal Rst may be selected as an n+2-th gate output signal Vg(n+2). The fourth switch TFT T4 discharges the Q node at the low potential level VL by connecting the Q node to the input terminal of the low potential voltage VSS according to the potential of the QB node.

The second switch TFT T2 discharges the QB node at the low potential level VL according to the potential of the Q node. The second switch TFT T2 acts to discharge the QB node when the Q node is charged.

The BTS compensation unit acts to periodically discharge the QB node according to the discharging control signal QBR to reduce the gate bias stress of the TFTs Tpd and T4 switched according to the potential of the QB node. Herein, the discharging control signal QBR may be selected as a clock CLKn+1 having an n+1-th phase, that is, a second clock CLK2 in an example of FIG. 6.

To this end, the BTS compensation unit includes a fifth switch TFT T5 switched in response to the discharging control signal QBR to discharge the QB node at the low potential level VL. A gate electrode of the fifth switch TFT T5 is connected to an input terminal of the discharging control signal QBR, a drain electrode is connected to the QB node, and a source electrode is connected to the input terminal of the low potential voltage VSS. The fifth switch TFT T5 is turned-on whenever the second clock CLK2 as the discharging control signal QBR is inputted at the high potential level VH to connect the QB node to the input terminal of the low potential voltage VSS. Accordingly, the QB node is discharged.

Meanwhile, the BTS compensation unit further includes a sixth switch TFT T6 switched in response to the discharging control signal QBR to discharge the output node NO at the low potential level VL. Accordingly, the n-th gate output signal Vg(n) is stably maintained at the gate low voltage just after resetting is performed and just until setting is performed in the next frame. The gate electrode of the sixth switch TFT T6 is connected to the input terminal of the discharging control signal QBR, the drain electrode is connected to the QB node, and the source electrode is connected to the input terminal of the low potential voltage VSS. A ripple current included in the n-th gate output signal Vg(n) may be effectively removed by a switching operation of the sixth switch TFT T6.

An operation of the n-th stage STGn shown in FIG. 5 will be described below with reference to FIG. 6.

When the start signal Vst is inputted during period ①, the Q node is charged at the high potential level VH by the high potential voltage VDD applied through the first switch TFT T1, and the QB node is discharged at the low potential level VL by the low potential voltage VSS applied through the second switch TFT T2.

When the clock CLKn having the n-th phase is inputted to the drain electrode of the pull-up TFT Tpu during period ②, the Q node and the drain electrode of the pull-up TFT Tpu are coupled to each other by a parasitic capacitor. Accordingly, the potential of the Q node is bootstrapped to a voltage that is higher than the high potential level VH. As a result, the pull-up TFT Tpu is turned-on. When the pull-up TFT Tpu is turned-on, the clock CLKn having the n-th phase, that is, the first clock CLK1, is applied as the n-th gate output signal Vg(n) to the output node NO. When the reset signal Rst (that is, the n+2-th gate output signal Vg(n+2)) is inputted during period ③, the Q node is discharged at the low potential level VL by the low potential voltage VSS applied through the third switch TFT T3. The second switch TFT T2 is turned-off to block a discharging path of the QB node. As a result, the QB node is charged at the high potential level VH by the high potential voltage VDD.

Whenever the fifth switch TFT T5 is periodically turned-on by the second clock CLK2 selected as the discharging control signal QBR during period ④, the QB node is discharged at the low potential level VL. The periodic discharging operation of the QB node may be performed just until setting is performed in the next frame. The gate bias stress applied to the TFTs is increased in proportion to a level of the applied voltage and an application time. Period ④ corresponds to most time of one frame. Since the QB node is periodically discharged during period ④, the gate bias stress of the TFTs Tpd and T4 switched according to the QB node is significantly reduced as compared to the known case when the potential of the QB node is continuously maintained at the high potential level VH. When the gate bias stress is reduced, a degradation of a threshold voltage of the TFTs (that is, a threshold voltage shift quantity) is reduced. Accordingly, reliability and stability of a stage circuit are increased, and thus a life-span of a scan driving circuit is increased.

Figure 8:
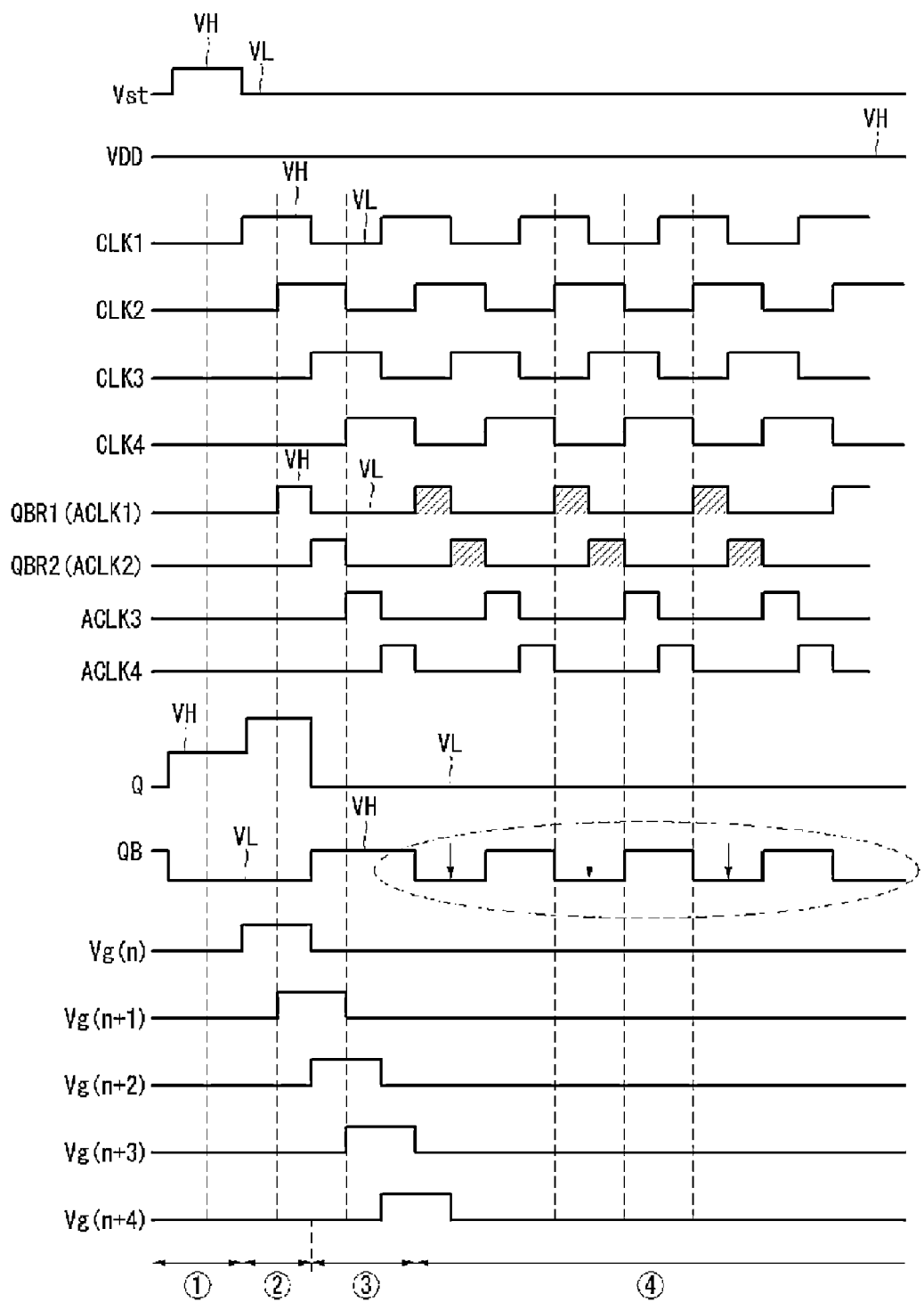
FIG. 8 is a view showing an operation waveform of the n-th stage shown in FIG. 7.

FIG. 7 shows another constitution of the n-th (n is a positive integer) stage STGn of the stages STG1 to STG4, . . . shown in FIG. 4. In addition, FIG. 8 shows an operation waveform of the n-th stage STGn shown in FIG. 7.

The n-th stage STGn of FIG. 7 is different from that of FIG. 5 in terms of only a constitution of the BTS compensation unit, but residual constitutions are substantially the same.

The BTS compensation unit of FIG. 7 includes a 5-1-th switch TFT T5-1 switched in response to a first discharging control signal QBR1 to discharge the QB node at the low potential level VL, and a 5-2-th switch TFT T5-2 switched in response to a second discharging control signal QBR2 to discharge the QB node at the low potential level VL. The gate electrode of the 5-1-th switch TFT T5-1 is connected to the input terminal of the first discharging control signal QBR1, the drain electrode is connected to the QB node, and the source electrode is connected to the input terminal of the low potential voltage VSS. The gate electrode of the 5-2-th switch TFT T5-2 is connected to the input terminal of the second discharging control signal QBR2, the drain electrode is connected to the QB node, and the source electrode is connected to the input terminal of the low potential voltage VSS.

The BTS compensation unit acts to periodically discharge the QB node according to the first and second discharging control signals QBR1 and QBR2 to reduce the gate bias stress of the TFTs Tpd and T4 switched according to the potential of the QB node. Herein, the first discharging control signal QBR1 may be selected as a separate first auxiliary clock (that is, ACLK1 in an example of FIG. 6) overlapping a portion of the clock CLKn+1 having the n+1-th phase. The second discharging control signal QBR2 may be selected as a separate second auxiliary clock (that is, ACLK2 in the example of FIG. 6) overlapping a remainder of the clock CLKn+1 having the n+1-th phase. An on duty of each of the first and second auxiliary clocks ACLK1 and ACLK2 is set to be ½ of the on duty of each of the four-phase clocks CLK1 to CLK4. Accordingly, the 5-1-th switch TFT T5-1 and the 5-2-th switch TFT T5-2 are alternately turned-on whenever the first and second auxiliary clocks ACLK1 and ACLK2 are inputted at the high potential level VH to connect the QB node to the input terminal of the low potential voltage VSS. Therefore, the QB node is discharged. The 5-1-th switch TFT T5-1 and the 5-2-th switch TFT T5-2 are alternately turned-on with the ½ on duty. Accordingly, a switching degradation is reduced in half as compared to FIG. 5.

Meanwhile, the BTS compensation unit of FIG. 7 further includes a 6-1-th switch TFT T6-1 switched in response to the first discharging control signal QBR1 to discharge the output node NO at the low potential level VL and a 6-2-th switch TFT T6-2 switched in response to the second discharging control signal QBR2 to discharge the output node NO at the low potential level VL. Accordingly, the n-th gate output signal Vg(n) is stably maintained at the gate low voltage just after resetting is performed and just until setting is performed in the next frame. The gate electrode of the 6-1 switch TFT T6-1 is connected to the input terminal of the first discharging control signal QBR1, the drain electrode is connected to the QB node, and the source electrode is connected to the input terminal of the low potential voltage VSS. The gate electrode of the 6-2 switch TFT T6-2 is connected to the input terminal of the second discharging control signal QBR2, the drain electrode is connected to the QB node, and the source electrode is connected to the input terminal of the low potential voltage VSS. The ripple current included in the n-th gate output signal Vg(n) may be effectively removed by the switching operation of the 6-1 and 6-2 switch TFTs T6-1 and T6-2.

The operation waveform of the n-th stage STGn shown in FIG. 8 is substantially the same as that of FIG. 6, except that the QB node is periodically discharged during period ④ according to the first and second auxiliary clocks ACLK1 and ACLK2 having a half duty as compared to the first to fourth clocks CLK1 to CLK4.

Figure 10:
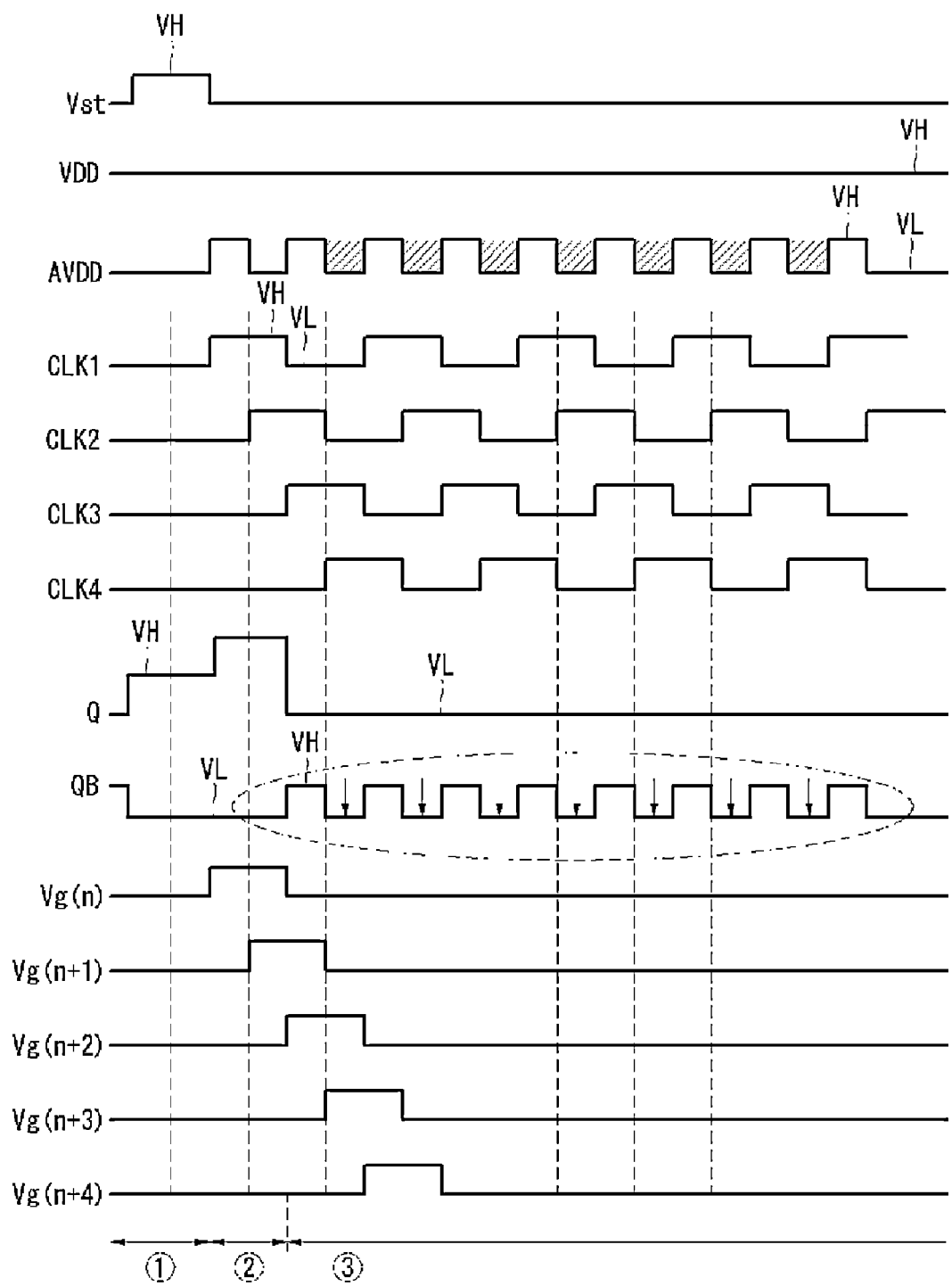
FIG. 10 is a view showing an operation waveform of the n-th stage shown in FIG. 9.

FIG. 9 shows yet another constitution of the n-th (n is a positive integer) stage STGn of the stages STG1 to STG4, . . . shown in FIG. 4. In addition, FIG. 10 shows an operation waveform of the n-th stage STGn shown in FIG. 9.

The n-th stage STGn of FIG. 9 is different from that of FIG. 5 in terms of only the constitution of the BTS compensation unit, but residual constitutions are substantially the same.

The BTS compensation unit of FIG. 9 includes the fifth switch TFT T5 supplying the alternating current high potential voltage AVDD to the QB node. The fifth switch TFT T5 is diode-connected to be connected to the input terminal of the alternating current high potential voltage AVDD and the QB node. In order to perform diode-connection, the gate electrode and the drain electrode of the fifth switch TFT T5 are connected to the input terminal of the alternating current high potential voltage AVDD. The source electrode of the fifth switch TFT T5 is connected to the QB node.

The second switch TFT T2 of FIG. 9 is maintained in a turn-off state just after resetting is performed and just until setting is performed in the next frame. Accordingly, the potential of the QB node depends on the alternating current high potential voltage AVDD. The potential of the QB node is charged when the alternating current high potential voltage AVDD is inputted at the high potential level VH and discharged when the alternating current high potential voltage AVDD is inputted at the low potential level VL. The BTS compensation unit of FIG. 9 acts to reduce the gate bias stress of the TFTs Tpd and T4 switched according to the potential of the QB node by applying the alternating current high potential voltage AVDD alternating the high potential level VH and the low potential level VL to the QB node to periodically discharge the QB node.

The operation waveform of the n-th stage STGn shown in FIG. 10 is substantially the same as that of FIG. 6, except that the QB node is periodically discharged during period ③ according to the alternating current high potential voltage AVDD swinging at the high potential level VH and the low potential level VL.

Figure 11:
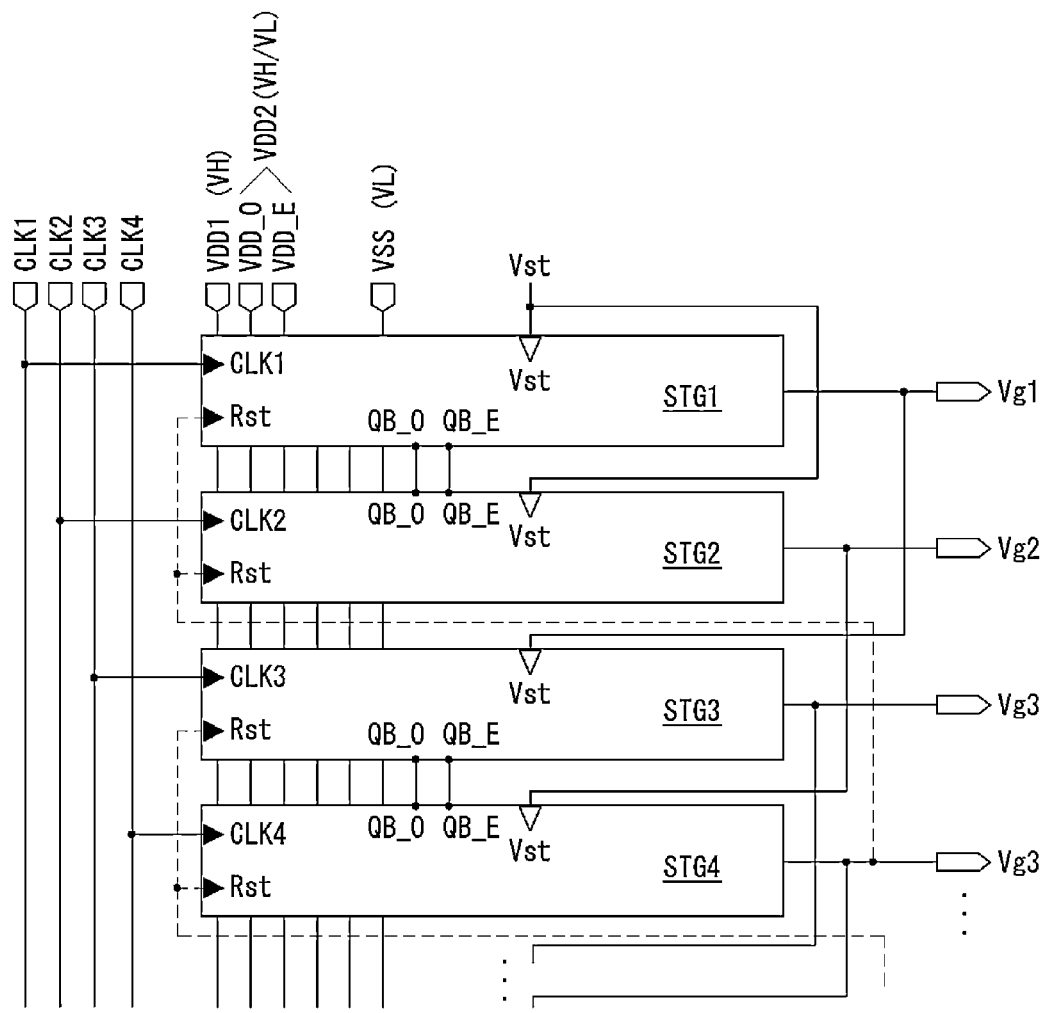
FIG. 11 is a view schematically showing a gate shift register according to another exemplary embodiment of the present invention.

FIG. 11 schematically shows a constitution of a gate shift register according to another exemplary embodiment of the present invention. FIG. 11 shows the constitution of the gate shift register for performing alternating current driving (two QB nodes and two pull-down TFTs are provided for each stage and the QB nodes are alternately idly driven on a cycle of a predetermined period). In FIG. 11, two adjacent stages share a first QB node QB_O and a second QB node QB_E with each other in order to reduce the number of TFTs and power lines included in the stages.

The constitution of the stage other than the constitution of alternating current driving is substantially the same as that of FIG. 5. A first high potential voltage VDD1, a second high potential voltage VDD2, and a low potential voltage VSS are supplied to each of the stages STG1 to STG4, . . . to perform alternating current driving.

The first high potential voltage VDD1 is constantly inputted at a high potential level VH.

The second high potential voltage VDD2 includes a 2-1-th high potential voltage VDD_O and a 2-2-th high potential voltage VDD_E. The 2-1-th high potential voltage VDD_O and the 2-2-th high potential voltage VDD_E oppositely swing on a cycle of a predetermined period (for example, k frame period) with a phase difference of about 180°. For example, when the 2-1-th high potential voltage VDD_O is inputted at the high potential level VH during an odd-numbered k frame period, the 2-2-th high potential voltage VDD_E may be inputted at a low potential level VL. On the contrary, when the 2-1-th high potential voltage VDD_O is inputted at the low potential level VH during an even-numbered k frame period, the 2-2-th high potential voltage VDD_E is inputted at the high potential level VH.

The first high potential voltage VDD1 is commonly inputted to all stages STG1 to STG4, . . . . However, the 2-1-th high potential voltage VDD_O and the 2-2-th high potential voltage VDD_E are respectively inputted to the two stages sharing the QB nodes QB_O and QB_E. For example, assuming that an n-th stage and an n+1-th stage share the QB nodes QB_O and QB_E with each other, the first high potential voltage VDD1 and the 2-1-th high potential voltage VDD_O are inputted to the n-th stage, and the first high potential voltage VDD1 and the 2-2-th high potential voltage VDD_E are inputted to the n+1-th stage.

Figure 12:
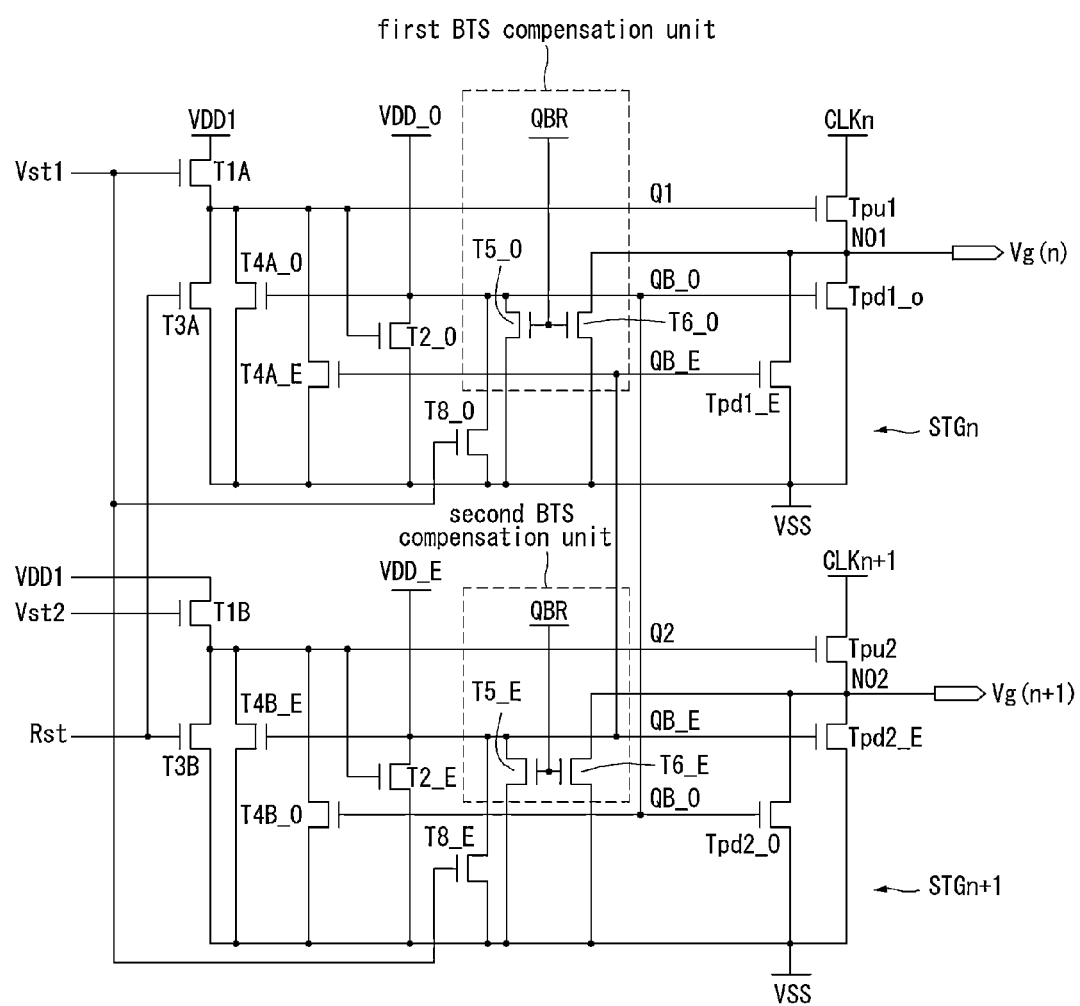
FIG. 12 is a view showing an n-th stage of stages shown in FIG. 11.
Figure 14:
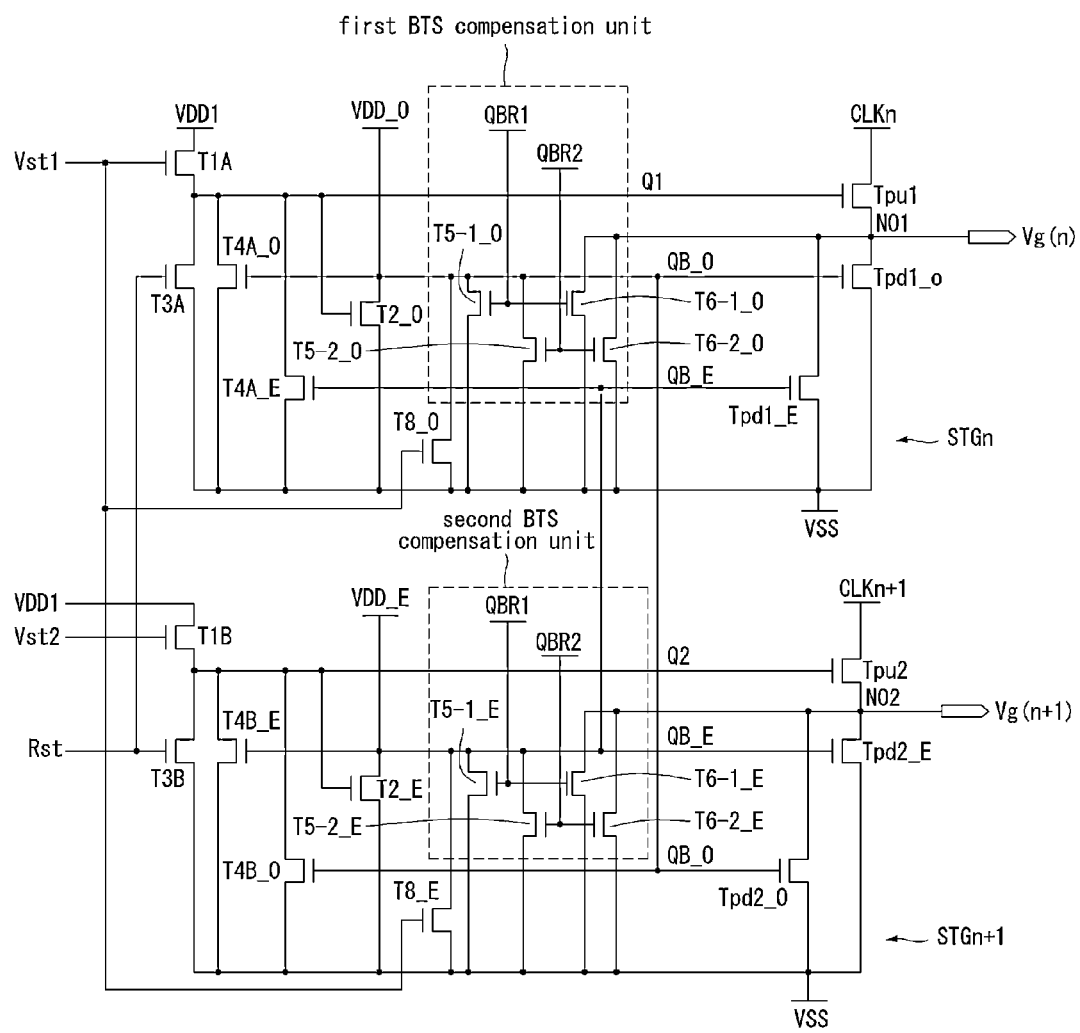
FIG. 14 is a view showing another constitution of the n-th stage of the stages shown in FIG. 11.
Figure 16:
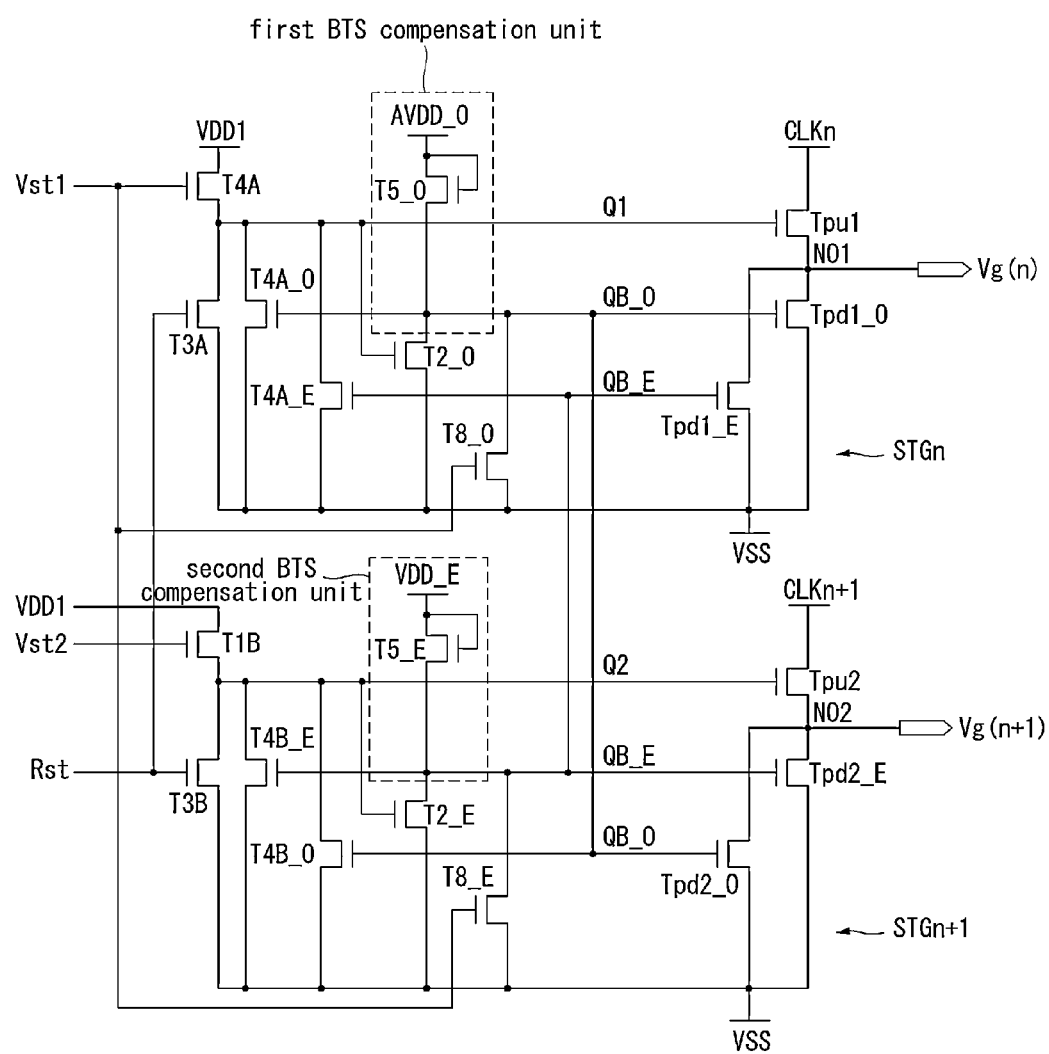
FIG. 16 is a view showing yet another constitution of the n-th stage of the stages shown in FIG. 11.

The two stages sharing the QB nodes QB_O and QB_E include two BTS compensation units alternately driven like in FIGS. 12, 14, and 16 to reduce gate bias stress of TFTs switched according to a potential of the QB nodes.

Figure 13:
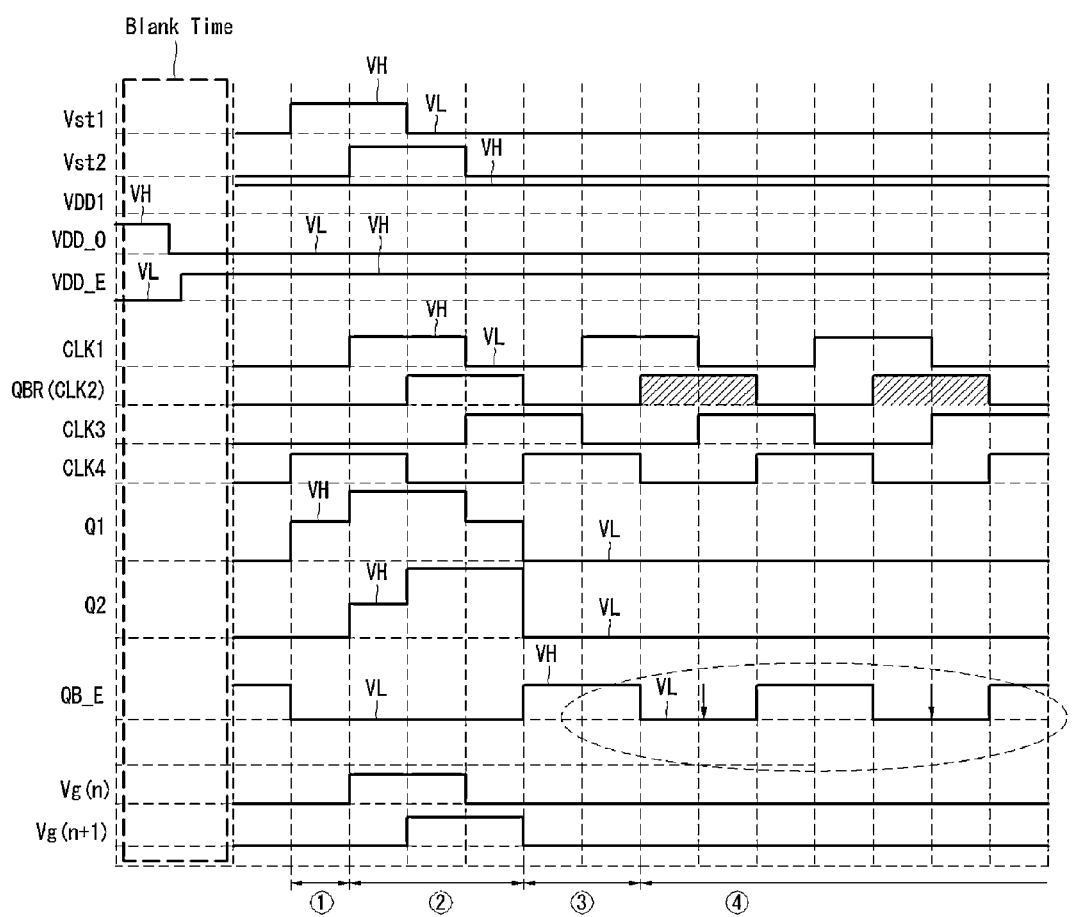
FIG. 13 is a view showing an operation waveform of the n-th stage shown in FIG. 12.

FIG. 12 shows a constitution of the n-th stage STGn and the n+1-th stage STGn+1 sharing the QB nodes among the stages STG1 to STG4, . . . shown in FIG. 11. In addition, FIG. 13 shows an operation waveform of the n-th stage STGn and the n+1-th stage STGn+1 shown in FIG. 12.

Referring to FIG. 12, the n-th stage STGn is provided with a first output node NO1 outputting an n-th gate output signal Vg(n), a first pull-up TFT Tpu1 switched according to the potential of a first Q node Q1, a 1-1-th pull-down TFT Tpd1_O switched according to the potential of the first QB node QB_O, a 1-2-th pull-down TFT Tpd1_E switched according to the potential of the second QB node QB_E, 1-1-th, 3-1-th, 4-1-th, and 4-2-th switch TFTs T1A, T3A, T4A_O, and T4A_E charging and discharging the first Q node Q1, a 2-1-th switch TFT T2_O discharging the first QB node QB_O according to the potential of the first Q node Q1, and a first BTS compensation unit reducing gate bias stress of the TFTs Tpd1_O, T4A_O, Tpd2_O, and T4B_O switched according to the potential of the first QB node QB_O. A detailed connection constitution of elements constituting the n-th stage STGn is similar to those of the aforementioned exemplary embodiments, and thus will be omitted.

In addition, the n+1-th stage STGn+1 is provided with a second output node NO2 outputting an n+1-th gate output signal Vg(n+1), a second pull-up TFT Tpu2 switched according to the potential of a second Q node Q2, a 2-1-th pull-down TFT Tpd2_O switched according to the potential of the first QB node QB_O, a 2-2-th pull-down TFT Tpd2_E switched according to the potential of the second QB node QB_E, 1-2-th, 3-2-th, 4-3-th, and 4-4-th switch TFTs T1B, T3B, T4B_O, and T4B_E charging and discharging the second Q node Q2, a 2-2-th switch TFT T2_E discharging the second QB node QB_E according to the potential of the second Q node Q2, and a second BTS compensation unit reducing the gate bias stress of the TFTs Tpd1_E, T4A_E, Tpd2_E, and T4B_E switched according to the potential of the second QB node QB_E. A detailed connection constitution of elements constituting the n+1-th stage STGn+1 is similar to those of the aforementioned exemplary embodiments, and thus will be omitted.

Meanwhile, the n-th stage STGn may further include a 8-1-th switch TFT T8_O. The n+1-th stage STGn+1 may further include a 8-2-th switch TFT T8_E. When the first QB node QB_O is normally driven, the 8-1-th switch TFT T8_O discharges the first QB node QB_O at the low potential level VL according to a first start signal Vst1 to completely turn-off the 4-1-th and 4-3-th switch TFTs T4A_O and T4B_O and induce stable charging of the first and second Q nodes Q1 and Q2 during period ① of FIG. 13. When the second QB node QB_E is normally driven, the 8-2-th switch TFT T8_E discharges the second QB node QB_E at the low potential level VL according to a first start signal Vst1 to completely turn-off the 4-2-th and 4-4-th switch TFTs T4A_E,T4B_E and induce stable charging of the first and second Q nodes Q1 and Q2 during period ① of FIG. 13.

The first QB node QB_O and the second QB node QB_E are alternately idly driven on a cycle of a predetermined period (for example, k frame period). The idly driven QB node is continuously maintained at the low potential level VL. Accordingly, elements relating to the first QB node QB_O and elements relating to the second QB node QB_E are alternately idly driven on a cycle of a predetermined period.

Examples of the elements relating to the first QB node QB_O include the 1-1-th pull-down TFT Tpd1_O, the 4-1-th switch TFT T4A_O, the 2-1-th pull-down TFT Tpd2_O, the 4-3-th switch TFT T4B_O, the first BTS compensation unit, and the 8-1-th switch TFT T8_O. In addition, examples of the elements relating to the second QB node QB_E include the 1-2-th pull-down TFT Tpd1_E, the 4-2-th switch TFT T4A_E, the 2-2-th pull-down TFT Tpd2_E, the 4-4-th switch TFT T4B_E, the second BTS compensation unit, and the 8-2-th switch TFT T8_E.

The n-th gate output signal Vg(n) outputted through the first output node NO1 of the n-th stage STGn is synchronized with a clock CLKn having an n-th phase. The n+1-th gate output signal Vg(n+1) outputted through the second output node NO2 of the n+1-th stage STGn+1 is synchronized with a clock CLKn+1 having an n+1-th phase. The phase of the first start signal Vst1 controlling set timing of the n-th stage STGn leades the phase of the n-th gate output signal Vg(n). The phase of a second start signal Vst2 controlling the set timing of the n+1-th stage STGn+1 leades the phase of the n+1-th gate output signal Vg n+1 and lags behind the phase of the first start signal Vst1. In addition, the phase of a reset signal Rst resetting the n-th stage STGn and the n+1-th stage STGn+1 simultaneously lags behind the phase of the n+1-th gate output signal Vg(n+1).

The first BTS compensation unit acts to periodically discharge the first QB node QB_O according to a discharging control signal QBR to reduce the gate bias stress of the TFTs Tpd1_O, T4A_O, Tpd2_O, and T4B_O switched according to the potential of the first QB node QB_O. Herein, the discharging control signal QBR may be selected as the clock CLKn+1 having the n+1-th phase, that is, a second clock CLK2 in an example of FIG. 13. To this end, the first BTS compensation unit includes a 5-1-th switch TFT T5_O switched in response to the discharging control signal QBR to discharge the first QB node QB_O at the low potential level VL. A gate electrode of the 5-1-th switch TFT T5_O is connected to an input terminal of the discharging control signal QBR, a drain electrode is connected to the first QB node QB_O, and a source electrode is connected to an input terminal of the low potential voltage VSS. The 5-1-th switch TFT T5_O is turned-on whenever the second clock CLK2 as the discharging control signal QBR is inputted at the high potential level VH to connect the first QB node QB_O to the input terminal of the low potential voltage VSS. Accordingly, the first QB node QB_O is discharged. Meanwhile, the first BTS compensation unit further includes a 6-1-th switch TFT T6_O switched in response to the discharging control signal QBR to discharge the first output node NO1 at the low potential level VL. Accordingly, the n-th gate output signal Vg(n) is stably maintained at a gate low voltage just after the n-th stage STGn is reset and just until the n-th stage STGn is set in a next frame. The gate electrode of the 6-1-th switch TFT T6_O is connected to the input terminal of the discharging control signal QBR, the drain electrode is connected to the first QB node QB_O, and the source electrode is connected to the input terminal of the low potential voltage VSS. A ripple current included in the n-th gate output signal Vg(n) may be effectively removed by a switching operation of the 6-1-th switch TFT T6_O.

The second BTS compensation unit and the first BTS compensation unit are alternately driven on a cycle of a predetermined period (for example, k frame period). The second BTS compensation unit acts to periodically discharge the second QB node QB_E according to the discharging control signal QBR to reduce the gate bias stress of the TFTs Tpd1_E, T4A_E, Tpd2_E, and T4B_E switched according to the potential of the second QB node QB_E. To this end, the second BTS compensation unit includes a 5-2-th switch TFT T5_E switched in response to the discharging control signal QBR to discharge the second QB node QB_E at the low potential level VL. The gate electrode of the 5-2-th switch TFT T5_E is connected to the input terminal of the discharging control signal QBR, the drain electrode is connected to the second QB node QB_E, and the source electrode is connected to the input terminal of the low potential voltage VSS. The 5-2-th switch TFT T5_E is turned-on whenever the second clock CLK2 as the discharging control signal QBR is inputted at the high potential level VH to connect the second QB node QB_E to the input terminal of the low potential voltage VSS. Accordingly, the second QB node QB_E is discharged. Meanwhile, the second BTS compensation unit further includes a 6-2-th switch TFT T6_E switched in response to the discharging control signal QBR to discharge the second output node NO2 at the low potential level VL. Accordingly, the n+1-th gate output signal Vg(n+1) is stably maintained at the gate low voltage just after the n+1-th stage STGn+1 is reset and just until the n+1-th stage STGn+1 is set in the next frame. The gate electrode of the 6-2-th switch TFT T6_E is connected to the input terminal of the discharging control signal QBR, the drain electrode is connected to the second QB node QB_E, and the source electrode is connected to the input terminal of the low potential voltage VSS. The ripple current included in the n+1-th gate output signal Vg(n+1) may be effectively removed by the switching operation of the 6-2-th switch TFT T6_E.

FIG. 13 shows the operations of the n-th and n+1-th stages STGn and STGn+1 of FIG. 12. FIG. 13 shows the case where the elements relating to the first QB node QB_O are idly driven and only the elements relating to the second QB node QB_E are normally driven during a specific k frame period as an example. In FIG. 13, the term "Blank Time" means a blank time between the k frame periods.

The operation process of FIG. 13 is similar to those of the aforementioned exemplary embodiments, and thus a detailed description thereof will be omitted. Whenever the 5-2-th switch TFT T5_E is periodically turned-on by the second clock CLK2 selected as the discharging control signal QBR during period ④ of FIG. 13, the second QB node QB_E is discharged at the low potential level VL. The periodic discharging operation of the QB node may be performed just until setting is performed in the next frame. Since the second QB node QB_E is periodically discharged during period ④, the gate bias stress of the TFTs switched according to the second QB node QB_E is significantly reduced as compared to the known case when the potential of the QB node is continuously maintained at the high potential level VH.

Figure 15:
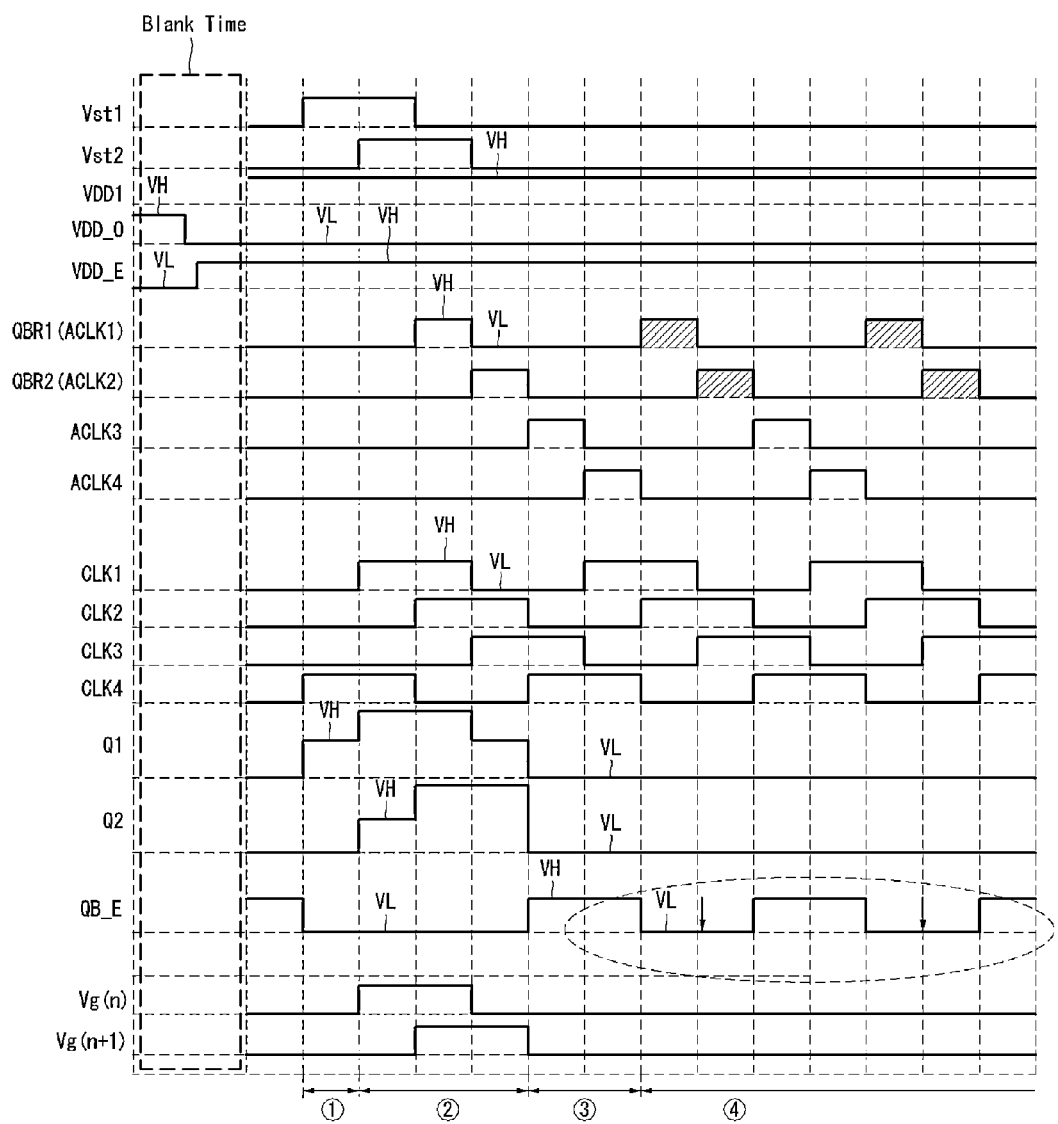
FIG. 15 is a view showing an operation waveform of the n-th stage shown in FIG. 14.

FIG. 14 shows another constitution of the n-th stage STGn and the n+1-th stage STGn+1 sharing the QB nodes among the stages STG1 to STG4, ... shown in FIG. 11. In addition, FIG. 15 shows an operation waveform of the n-th stage STGn and the n+1-th stage STGn+1 shown in FIG. 14.

The constitution of the stage of FIG. 14 is different from that of FIG. 12 in terms of only the constitutions of the first and second BTS compensation units, but other constitutions are substantially the same.

The first BTS compensation unit of FIG. 14 includes a 5-1-th odd switch TFT T5-1_O switched in response to a first discharging control signal QBR1 to discharge the first QB node QB_O at the low potential level VL, and a 5-2-th odd switch TFT T5-2_O switched in response to a second discharging control signal QBR2 to discharge the first QB node QB_O at the low potential level VL. The gate electrode of the 5-1-th odd switch TFT T5-1_O is connected to the input terminal of the first discharging control signal QBR1, the drain electrode is connected to the first QB node QB_O, and the source electrode is connected to the input terminal of the low potential voltage VSS. The gate electrode of the 5-2-th odd switch TFT T5-2_O is connected to the input terminal of the second discharging control signal QBR2, the drain electrode is connected to the first QB node QB_O, and the source electrode is connected to the input terminal of the low potential voltage VSS.

The first BTS compensation unit acts to periodically discharge the first QB node QB_O according to the first and second discharging control signals QBR1 and QBR2 to reduce the gate bias stress of the TFTs Tpd1_O, T4A_O, Tpd2_O, and T4B_O switched according to the potential of the first QB node QB_O. Herein, the first discharging control signal QBR1 may be selected as a separate first auxiliary clock (that is, ACLK1 in an example of FIG. 15) overlapping a portion of the clock CLKn+1 having the n+1-th phase. The second discharging control signal QBR2 may be selected as a separate second auxiliary clock (that is, ACLK2 in the example of FIG. 15) overlapping a remainder of the clock CLKn+1 having the n+1-th phase. An on duty of each of the first and second auxiliary clocks ACLK1 and ACLK2 is set to be ½ of the on duty of each of four-phase clocks CLK1 to CLK4. Accordingly, the 5-1-th odd switch TFT T5-1_O and the 5-2-th odd switch TFT T5-2_O are alternately turned-on whenever the first and second auxiliary clocks ACLK1 and ACLK2 are inputted at the high potential level VH to connect the first QB node QB_O to the input terminal of the low potential voltage VSS. Accordingly, the first QB node QB_O is discharged. The 5-1-th odd switch TFT T5-1_O and the 5-2-th odd switch TFT T5-2_O are alternately turned-on with the ½ on duty. Accordingly, a switching degradation is reduced in half as compared to FIG. 11.

Meanwhile, the first BTS compensation unit of FIG. 14 further includes a 6-1-th odd switch TFT T6-1_O switched in response to the first discharging control signal QBR1 to discharge the first output node NO1 at the low potential level VL and a 6-2-th odd switch TFT T6-2_O switched in response to the second discharging control signal QBR2 to discharge the first output node NO1 at the low potential level VL. Accordingly, the n-th gate output signal Vg(n) is stably maintained at the gate low voltage just after the n-th stage STGn is reset and just until the n-th stage STGn is set in the next frame. The gate electrode of the 6-1-th odd switch TFT T6-1_O is connected to the input terminal of the first discharging control signal QBR1, the drain electrode is connected to the first QB node QB_O, and the source electrode is connected to the input terminal of the low potential voltage VSS. The gate electrode of the 6-2-th odd switch TFT T6-2_O is connected to the input terminal of the second discharging control signal QBR2, the drain electrode is connected to the first QB node QB_O, and the source electrode is connected to the input terminal of the low potential voltage VSS. The ripple current included in the n-th gate output signal Vg(n) may be effectively removed by the switching operation of the 6-1-th and the 6-2-th odd switch TFTs T6-1_O and T6-2_O.

The second BTS compensation unit of FIG. 14 and the first BTS compensation unit are alternately driven on a cycle of a predetermined period (for example, k frame period). The second BTS compensation unit includes a 5-1-th even switch TFT T5-1_E switched in response to the first discharging control signal QBR1 to discharge the second QB node QB_E at the low potential level VL, and a 5-2-th even switch TFT T5-2_E switched in response to the second discharging control signal QBR2 to discharge the second QB node QB_E at the low potential level VL. The gate electrode of the 5-1-th even switch TFT T5-1_E is connected to the input terminal of the first discharging control signal QBR1, the drain electrode is connected to the second QB node QB_E, and the source electrode is connected to the input terminal of the low potential voltage VSS. The gate electrode of the 5-2-th even switch TFT T5-2_E is connected to the input terminal of the second discharging control signal QBR2, the drain electrode is connected to the second QB node QB_E, and the source electrode is connected to the input terminal of the low potential voltage VSS.

The second BTS compensation unit acts to periodically discharge the second QB node QB_E according to the first and second discharging control signals QBR1 and QBR2 to reduce the gate bias stress of the TFTs Tpd1_E, T4A_E, Tpd2_E, and T4B_E switched according to the potential of the second QB node QB_E. Accordingly, the 5-1-th even switch TFT T5-1_E and the 5-2-th even switch TFT T5-2_E are alternately turned-on whenever the first and second auxiliary clocks ACLK1 and ACLK2 are inputted at the high potential level VH to connect the second QB node QB_E to the input terminal of the low potential voltage VSS. Accordingly, the second QB node QB_E is discharged. The 5-1-th even switch TFT T5-1_E and the 5-2-th even switch TFT T5-2_E are alternately turned-on with the ½ on duty. Accordingly, the switching degradation is reduced in half as compared to FIG. 11.

Meanwhile, the second BTS compensation unit of FIG. 14 further includes a 6-1-th even switch TFT T6-1_E switched in response to the first discharging control signal QBR1 to discharge the second output node NO2 at the low potential level VL and a 6-2-th even switch TFT T6-2_E switched in response to the second discharging control signal QBR2 to discharge the second output node NO2 at the low potential level VL. Accordingly, the n+1-th gate output signal Vg(n+1) is stably maintained at the gate low voltage just after the n+1-th stage STGn+1 is reset and just until the n+1-th stage STGn+1 is set in the next frame. The gate electrode of the 6-1-th even switch TFT T6-1_E is connected to the input terminal of the first discharging control signal QBR1, the drain electrode is connected to the second QB node QB_E, and the source electrode is connected to the input terminal of the low potential voltage VSS. The gate electrode of the 6-2-th even switch TFT T6-2_E is connected to the input terminal of the second discharging control signal QBR2, the drain electrode is connected to the second QB node QB_E, and the source electrode is connected to the input terminal of the low potential voltage VSS. The ripple current included in the n+1-th gate output signal Vg(n+1) may be effectively removed by the switching operation of the 6-1-th and 6-2-th even switch TFTs T6-1_E and T6-2_E.

The operation waveform of the stages shown in FIG. 15 is substantially the same as that of FIG. 13, except that the second QB node QB_E is periodically discharged during period ④ according to the first and second auxiliary clocks ACLK1 and ACLK2 having a half duty as compared to the first to fourth clocks CLK1 to CLK4.

Figure 17:
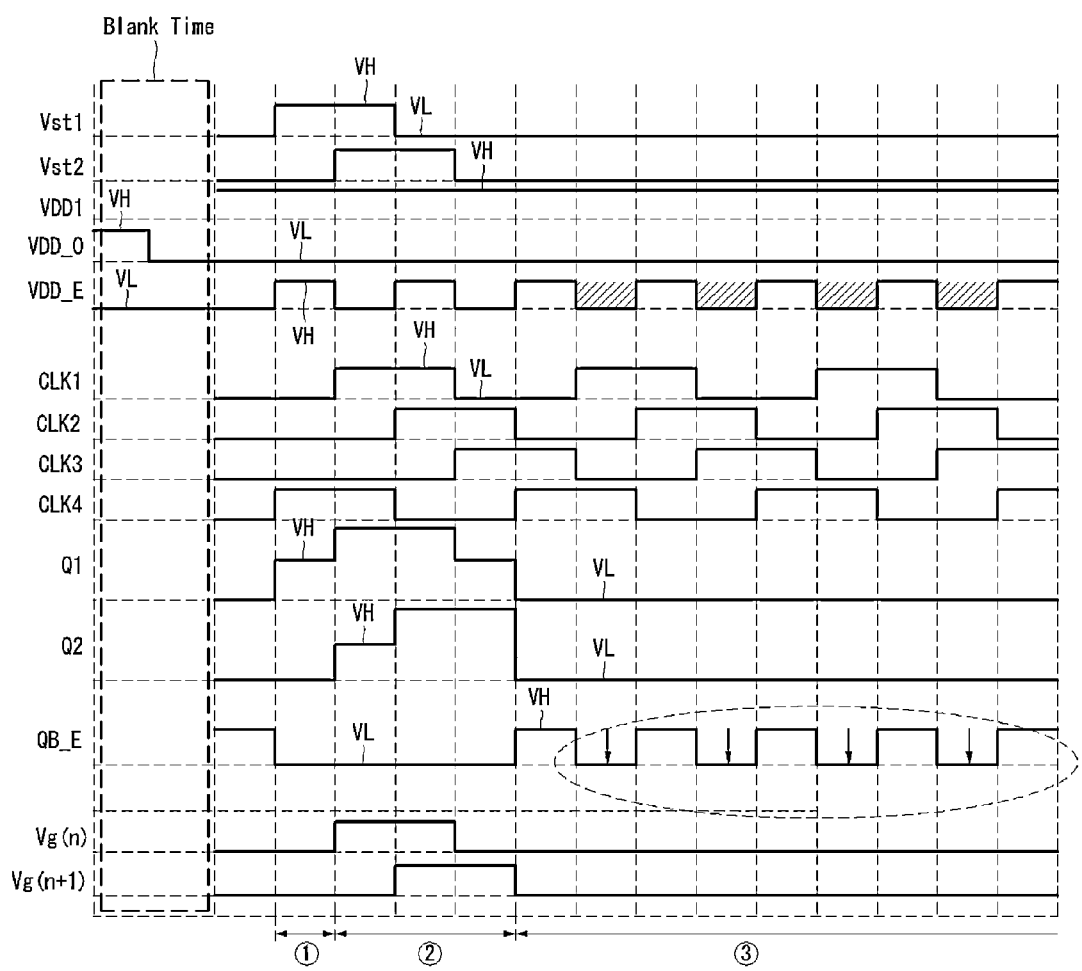
FIG. 17 is a view showing an operation waveform of the n-th stage shown in FIG. 16.

FIG. 16 shows yet another constitution of the n-th stage STGn and the n+1-th stage STGn+1 sharing the QB nodes among the stages STG1 to STG4, . . . shown in FIG. 11. In addition, FIG. 17 shows an operation waveform of the n-th stage STGn and the n+1-th stage STGn+1 shown in FIG. 16.

The constitution of the stage of FIG. 16 is different from that of FIG. 12 in terms of only the constitutions of the first and second BTS compensation units, but other constitutions are substantially the same.

The first BTS compensation unit and the second BTS compensation unit are alternately driven on a cycle of a predetermined period (for example, k frame period). A first alternating current high potential voltage AVDD_O and a second alternating current high potential voltage AVDD_E are alternately inputted as an alternating current voltage on a cycle of a predetermined period. When any one of the first alternating current high potential voltage AVDD_O and the second alternating current high potential voltage AVDD_E is inputted as the alternating current voltage swinging at the high potential level VH and the low potential level VL, another is inputted as a direct current voltage of the low potential level VL.

The operation of the first BTS compensation unit is activated when the first alternating current high potential voltage AVDD_O is inputted as the alternating current voltage. However, the operation is deactivated when the first alternating current high potential voltage AVDD_O is inputted as the direct current voltage. Likewise, the operation of the second BTS compensation unit is activated when the second alternating current high potential voltage AVDD_E is inputted as the alternating current voltage. However, the operation is deactivated when the second alternating current high potential voltage AVDD_E is inputted as the direct current voltage.

The first BTS compensation unit of FIG. 16 includes the 5-1-th switch TFT T5_O supplying the first alternating current high potential voltage AVDD_O to the first QB node QB_O. The 5-1-th switch TFT T5_O is diode-connected to be connected to the input terminal of the first alternating current high potential voltage AVDD_O and the first QB node QB_O. In order to perform diode-connection, the gate electrode and the drain electrode of the 5-1-th switch TFT T5_O are connected to the input terminal of the first alternating current high potential voltage AVDD_O. The source electrode of the 5-1-th switch TFT T5_O is connected to the first QB node QB_O.

The 2-1-th switch TFT T2_O of FIG. 16 is maintained in a turn-off state just after the n-th stage STGn is reset and just until the n-th stage STGn is set in the next frame during an activation period of the first BTS compensation unit. Accordingly, the potential of the first QB node QB_O depends on an alternating current type of first alternating current high potential voltage AVDD_O. The potential of the first QB node QB_O is charged when the first alternating current high potential voltage AVDD_O is inputted at the high potential level VH and discharged when the first alternating current high potential voltage AVDD_O is inputted at the low potential level VL. The first BTS compensation unit of FIG. 16 acts to reduce the gate bias stress of the TFTs Tpd1_O, T4A_O, Tpd2_O, and T4B_O switched according to the potential of the first QB node QB_O by applying the alternating current type of first alternating current high potential voltage AVDD_O to the first QB node QB_O to periodically discharge the first QB node QB_O.

The second BTS compensation unit of FIG. 16 includes the 5-2-th switch TFT T5_E supplying the second alternating current high potential voltage AVDD_E to the second QB node QB_E. The 5-2-th switch TFT T5_E is diode-connected to be connected to the input terminal of the second alternating current high potential voltage AVDD_E and the second QB node QB_E. In order to perform diode-connection, the gate electrode and the drain electrode of the 5-2-th switch TFT T5_E are connected to the input terminal of the second alternating current high potential voltage AVDD_E. The source electrode of the 5-2-th switch TFT T5_E is connected to the second QB node QB_E.

The 2-2-th switch TFT T2_E of FIG. 16 is maintained in a turn-off state just after the n+1-th stage STGn+1 is reset and just until the n+1-th stage STGn+1 is set in the next frame during the activation period of the second BTS compensation unit. Accordingly, the potential of the second QB node QB_E depends on the alternating current type of second alternating current high potential voltage AVDD_E. The potential of the second QB node QB_E is charged when the second alternating current high potential voltage AVDD_E is inputted at the high potential level VH and discharged when the second alternating current high potential voltage AVDD_E is inputted at the low potential level VL. The second BTS compensation unit of FIG. 16 acts to reduce the gate bias stress of the TFTs Tpd1_E, T4A_E, Tpd2_E, and T4B_E switched according to the potential of the second QB node QB_E by applying the alternating current type of second alternating current high potential voltage AVDD_E to the second QB node QB_E to periodically discharge the second QB node QB_E.

FIG. 17 shows an operation example where the second alternating current high potential voltage AVDD_E is inputted in the alternating current type to activate the second BTS compensation unit. Operation waveforms of the stages of FIG. 17 are substantially the same as that of FIG. 13, except that the second QB node QB_E is periodically discharged during period ③ according to the alternating current type of second alternating current high potential voltage AVDD_E.

Figure 18:
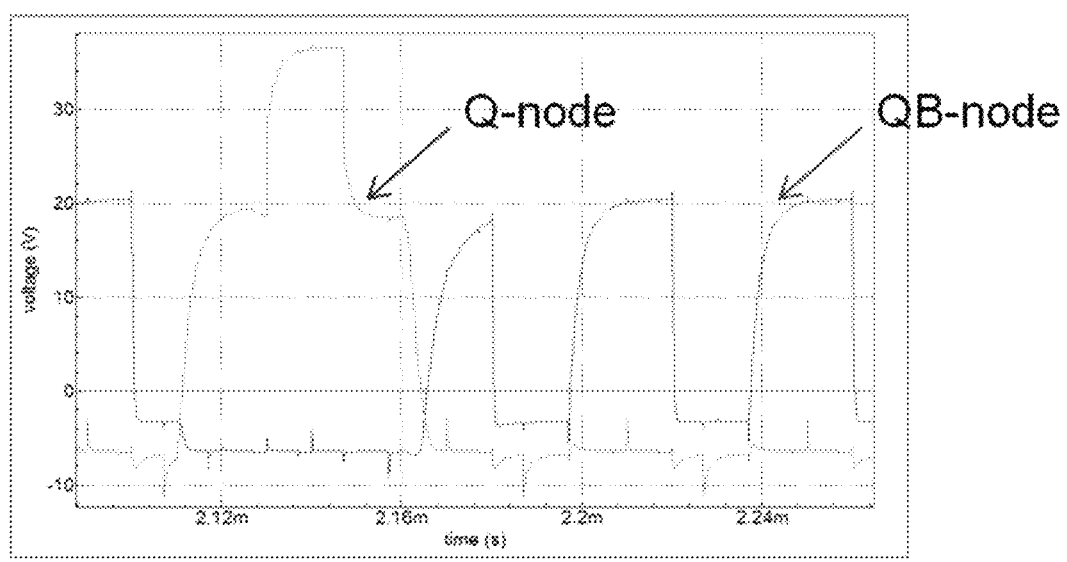
FIGS. 18 and 19 are waveform views showing simulation results of a portion of the exemplary embodiments. And, FIG. 20 schematically shows a display device according to the exemplary embodiments of the present invention.
Figure 19:
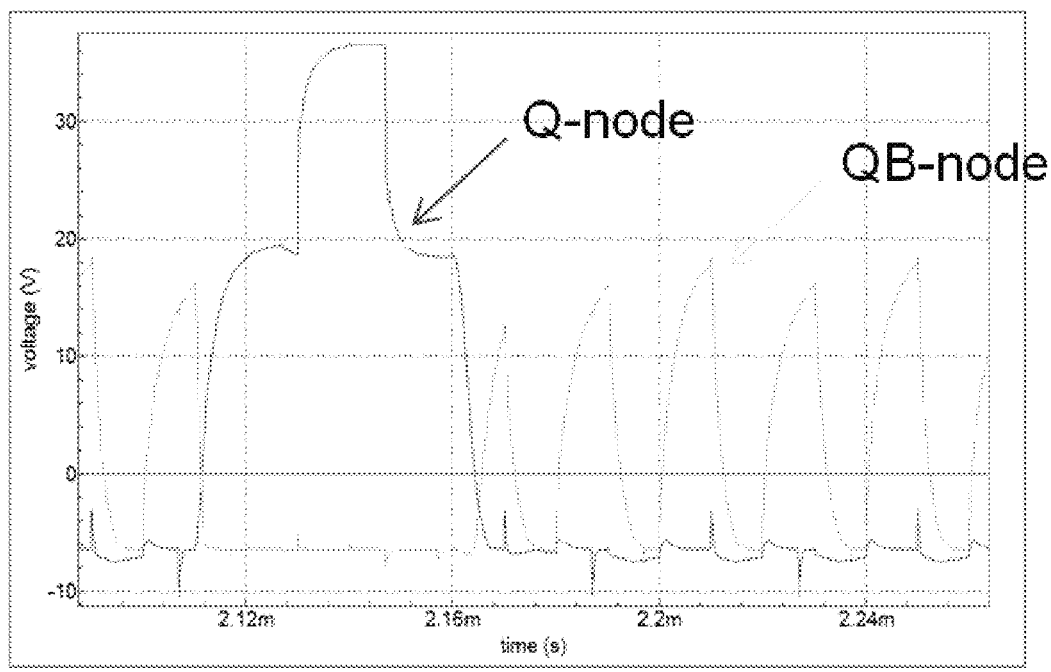

FIGS. 18 and 19 are waveform views showing simulation results of a portion of the exemplary embodiments.

FIG. 18 is a simulation result of a circuit constitution of the stage of FIGS. 5 and 7. FIG. 19 is a simulation result of the circuit constitution of the stage of FIG. 9.

As apparent from FIGS. 18 and 19, it can be seen that the potential of the QB node is not maintained only in a charging state but periodically discharged just after the corresponding stage is reset and just until the corresponding stage is set in the next frame unlike a known art. Through this, the present invention may reduce a threshold voltage degradation (that is, threshold voltage shift amount) of the TFTs to improve reliability of a circuit.

Figure 20:
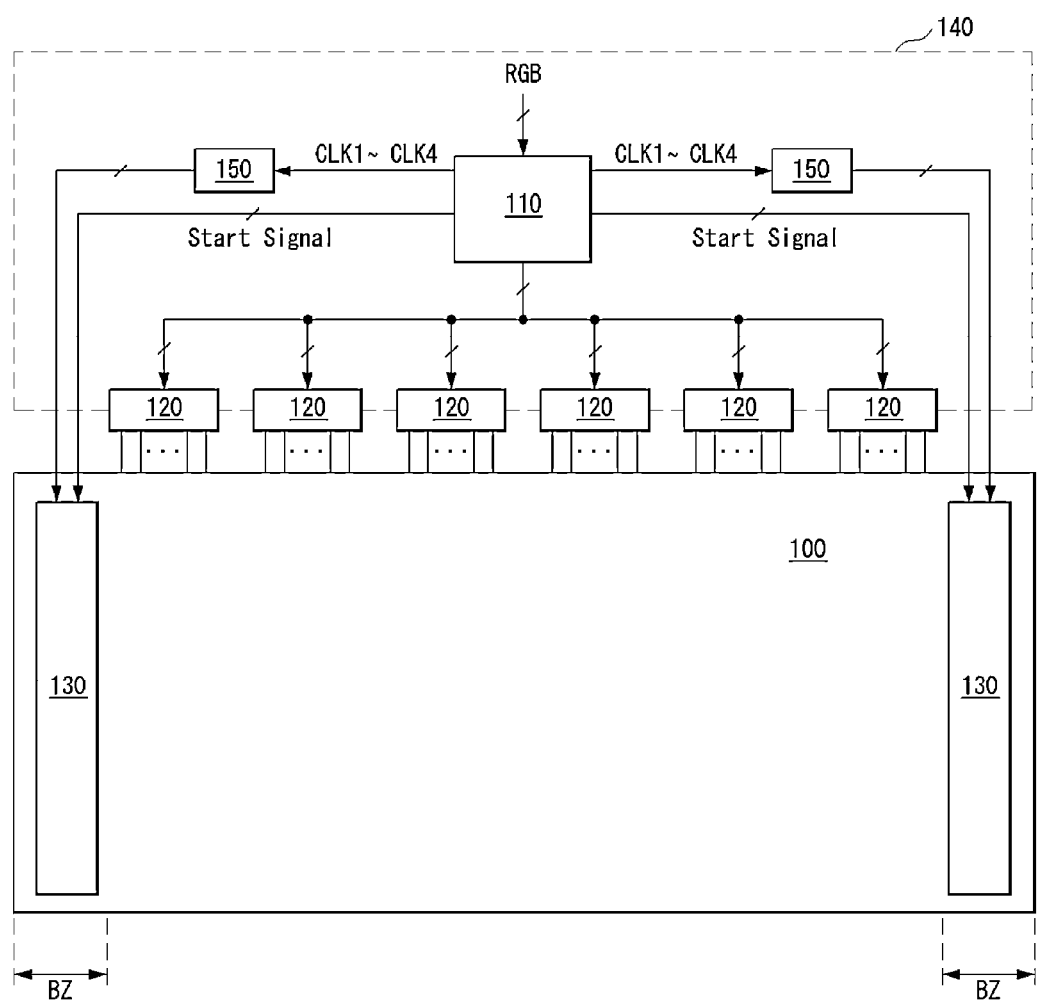

FIG. 20 schematically shows a display device according to the exemplary embodiment of the present invention.

Referring to FIG. 20, the display device of the present invention is provided with a display panel 100, a data driving circuit, a scan driving circuit, and a timing controller 110.

The display panel 100 includes data lines and scan lines crossing each other, and pixels disposed in a matrix form. The display panel 100 may be embodied as any one display panel of a liquid crystal display (LCD), an organic light emitting diode display (OLED), and an electrophoretic display (EPD).

The data driving circuit includes a plurality of source drive ICs 120. The source drive ICs 120 receive digital video data RGB from the timing controller 110. The source drive ICs 120 responds to a source timing control signal from the timing controller 110 to convert the digital video data RGB into gamma compensation voltages, thus generating data voltages. The data voltages are supplied to the data lines of the display panel 100 to be synchronized with a scan pulse. The source drive ICs may be connected to the data lines of the display panel 100 by a COG (chip on glass) process or a TAB (tape automated bonding) process.

The scan driving circuit is provided with a level shifter 150 connected between the scan lines of the timing controller 110 and the display panel 100, and a gate shift register 130.

The level shifter 150 performs level shifting of a TTL (transistor-transistor-logic) level voltage of i-phase (for example, four phase) gate shift clocks CLK1 to CLK4 inputted from the timing controller 110 into a gate high voltage and a gate low voltage at which the TFT formed on the display panel is capable of being switched.

As described above, the gate shift register 130 is constituted by the stages shifting the start signal to match the gate shift clocks CLK1 to CLK4 to sequentially generate the gate output signals. A detailed constitution and an operation of the gate shift register 130 are shown in FIGS. 4 to 19.

The scan driving circuit may be directly formed on a lower substrate of the display panel 100 in a GIP (gate in panel) mode. In the GIP mode, the level shifter 150 may be mounted on a PCB 140, and the gate shift register 130 may be formed on the lower substrate of the display panel 100. The gate shift register 130 is formed in a region where an image is not displayed (that is, a Bezel region BZ) in the display panel 100.

The timing controller 110 receives the digital video data RGB from an external host computer through interfaces such as a LVDS (low voltage differential signaling) interface and a TMDS (transition minimized differential signaling) interface. The timing controller 110 transmits the digital video data RGB inputted from the host computer to the source drive ICs 120.

The timing controller 110 receives timing signals such as a vertical synchronization signal Vsync, a horizontal synchronization signal Hsync, a data enable signal DE, and a main clock MCLK from the host computer through a LVDS or TMDS interface receiving circuit. The timing controller 110 generates the timing control signals controlling operation timing of the data driving circuit and the scan driving circuit based on the timing signal from the host computer. The timing control signals include a scan timing control signal controlling operation timing of the scan driving circuit, and a data timing control signal controlling operation timing of the source drive ICs 120 and polarity of the data voltage.

The scan timing control signal includes a gate start pulse, the gate shift clocks CLK1 to CLK4, and a gate output enable signal GOE not shown in the drawings. The gate start pulse is inputted to the gate shift register 130 to control shift start timing. The gate shift clocks CLK1 to CLK4 are inputted to the gate shift register 130 after level shifting is performed through the level shifter 150. The gate shift clocks CLK1 to CLK4 are used as clock signals shifting the start signal. The gate output enable signal GOE controls output timing of the gate shift register 130.

The data timing control signal includes a source start pulse SSP, a source sampling clock SSC, a polarity control signal POL, and a source output enable signal SOE. The source start pulse SSP controls shift start timing of the source drive ICs 120. The source sampling clock SSC is a clock signal controlling sampling timing of the data in the source drive ICs 120 based on a rising or falling edge. The polarity control signal POL controls polarity of the data voltage outputted from the source drive ICs. When a data transmission interface between the timing controller 110 and the source drive ICs 120 is a mini LVDS interface, the source start pulse SSP and the source sampling clock SSC may be omitted.

As described above, in the gate shift register according to the present invention and the display device using the same, the potential of the QB node may not be maintained only in a charging state but periodically discharged unlike a known art just after the corresponding stage is reset and just until the corresponding stage is set in the next frame to reduce the gate bias stress of the TFTs switched according to the potential of the QB node. Accordingly, a life-span of the scan driving circuit may be increased.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A gate shift register comprising:
a plurality of stages dependently connected to each other and receiving a plurality of clocks having sequentially shifted phases to generate gate output signals,
wherein an n-th stage of the plurality of stages includes:
a first output node outputting an n-th gate output signal of the gate output signals;
a first pull-up TFT switching a current flow between an input terminal receiving a first phase clock of the plurality of clocks and the first output node according to a potential of a first Q node;
a 1-1-th pull-down TFT switching the current flow between an input terminal of a low potential voltage and the first output node according to a potential of a first QB node charged and discharged differently from the first Q node;
a 1-1-th switch TFT charging the first Q node at a high potential level by connecting an input terminal of a first high potential voltage to the first Q node according to a first start signal having a phase leading a phase of the n-th gate output signal;
a 2-1-th switch TFT discharging the first QB node at a low potential level according to the potential of the first Q node;
a 3-1-th switch TFT discharging the first Q node at the low potential level according to a reset signal having a phase lagging behind the phase of the n-th gate output signal;
a 4-1-th switch TFT discharging the first Q node at the low potential level according to the potential of the first QB node; and
a first BTS compensation unit periodically discharging the first QB node at the low potential level just after the n-th stage is reset and just until the n-th stage is set in a next frame, according to a second phase clock corresponding to an n+1-th stage,
wherein the first phase clock and the second phase clock are respectively synchronized with the n-th gate output signal and an n+1-th gate output signal of the n+1-th stage, and
wherein a high potential level phase and a low potential level phase of the second phase clock overlap with and are sequentially shifted from a corresponding high potential level phase and a corresponding low potential level phase of the first phase clock,
wherein the first BTS compensation unit includes a fifth switch TFT switched according to the second phase clock to connect the first QB node to an input terminal of the low potential voltage,
wherein the first BTS compensation unit further includes a sixth switch TFT switched according to the second phase clock to connect the first output node to the input terminal of the low potential voltage, and
wherein a gate electrode of the sixth switch TFT is directly connected to the input terminal for the second phase clock, a drain electrode is directly connected to the first output node, and a source electrode is connected to the input terminal of the low potential voltage.

2. The gate shift register of claim 1, wherein a phase of the second phase clock is shifted 90 degrees relative to a phase of the first phase clock.

3. A gate shift register comprising:
a plurality of stages receiving a plurality of clocks where phases are sequentially shifted to generate gate output signals, wherein an n-th stage of the stages dependently connected to each other includes
a first output node outputting an n-th gate output signal of the gate output signals;
a first pull-up TFT switching a current flow between an input terminal of a clock having an n-th phase among the clocks and the first output node according to a potential of a first Q node;
a 1-1-th pull-down TFT switching the current flow between an input terminal of a low potential voltage and the first output node according to a potential of a first QB node charged and discharged differently from the first Q node;
a 1-1-th switch TFT charging the first Q node at a high potential level by connecting an input terminal of a first high potential voltage to the first Q node according to a first start signal having a phase leading a phase of the n-th gate output signal;
a 2-1-th switch TFT discharging the first QB node at a low potential level according to the potential of the first Q node;
a 3-1-th switch TFT discharging the first Q node at the low potential level according to a reset signal having a phase lagging behind the phase of the n-th gate output signal;
a 4-1-th switch TFT discharging the first Q node at the low potential level according to the potential of the first QB node; and
a first BTS compensation unit periodically discharging the first QB node at the low potential level just after the n-th stage is reset and just until the n-th stage is set in a next frame,
wherein the first BTS compensation unit includes
a 5-1-th switch TFT switched according to a first discharging control signal to connect the first QB node to an input terminal of the low potential voltage; and
a 5-2-th switch TFT switched according to a second discharging control signal to connect the first QB node to the input terminal of the low potential voltage, the first discharging control signal is selected as a separate first auxiliary clock overlapping a portion of the clock having a n+1-th phase among the clocks, the second discharging control signal is selected as a separate second auxiliary clock overlapping a remainder of the clock having the n+1-th phase, and an on duty of each of the first and second auxiliary clocks is set to be ½ of the on duty of each of the clocks.

4. The gate shift register of claim 3, wherein the first BTS compensation unit further includes
a 6-1-th switch TFT switched according to the first discharging control signal to connect the first output node to the input terminal of the low potential voltage; and
a 6-2-th switch TFT switched according to the second discharging control signal to connect the first output node to the input terminal of the low potential voltage.

5. A gate shift register comprising:
a plurality of stages receiving a plurality of clocks where phases are sequentially shifted to generate gate output signals,
wherein an n-th stage of the stages dependently connected to each other includes
a first output node outputting an n-th gate output signal of the gate output signals;
a first pull-up TFT switching a current flow between an input terminal of a clock having an n-th phase among the clocks and the first output node according to a potential of a first Q node;
a 1-1-th pull-down TFT switching the current flow between an input terminal of a low potential voltage and the first output node according to a potential of a first QB node charged and discharged differently from the first Q node;
a 1-1-th switch TFT charging the first Q node at a high potential level by connecting an input terminal of a first high potential voltage to the first Q node according to a first start signal having a phase leading a phase of the n-th gate output signal;
a 2-1-th switch TFT discharging the first QB node at a low potential level according to the potential of the first Q node;
a 3-1-th switch TFT discharging the first Q node at the low potential level according to a reset signal having a phase lagging behind the phase of the n-th gate output signal;
a 4-1-th switch TFT discharging the first Q node at the low potential level according to the potential of the first QB node; and
a first BTS compensation unit periodically discharging the first QB node at the low potential level just after the n-th stage is reset and just until the n-th stage is set in a next frame,
wherein the n-th stage further includes
a 1-2-th pull-down TFT switching a current flow between an input terminal of the low potential voltage and the first output node according to the potential of a second QB node alternately driven with the first QB node; and
a 4-2-th switch TFT discharging the first Q node at the low potential level according to a potential of the second QB node,
an n+1-th stage of the stages includes
a second output node outputting an n+1-th gate output signal of the gate output signals;
a second pull-up TFT switching the current flow between an input terminal of a clock having an n+1-th phase among the clocks and the second output node according to a potential of a second Q node;
a 2-1-th pull-down TFT switching the current flow between the input terminal of the low potential voltage and the second output node according to the potential of the first QB node;
a 2-2-th pull-down TFT switching the current flow between the input terminal of the low potential voltage and the second output node according to the potential of the second QB node;
a 1-2-th switch TFT charging the second Q node at the high potential level by connecting the input terminal of the first high potential voltage to the second Q node according to a second start signal having the phase leading the phase of the n+1-th gate output signal and lagging behind the phase of the first start signal;
a 2-2-th switch TFT discharging the second QB node at the low potential level according to the potential of the second Q node;
a 3-2-th switch TFT discharging the second Q node at the low potential level according to the reset signal having the phase lagging behind the phase of the n+1-th gate output signal;
a 4-3-th switch TFT discharging the second Q node at the low potential level according to the potential of the first QB node;

a 4-4-th switch TFT discharging the second Q node at the low potential level according to the potential of the second QB node; and a second BTS compensation unit periodically discharging the second QB node at the low potential level just after the n+1-th stage is reset and just until the n+1-th stage is set in the next frame, the n-th stage and the n+1-th stage share the first QB node with each other and also the second QB node with each other, the first QB node and the second QB node are alternately idly driven on a cycle of a predetermined period, and the idly driven QB node is continuously maintained at the low potential level, wherein the first BTS compensation unit includes a 5-1-th switch TFT switched according to a discharging control signal to connect the first QB node to the input terminal of the low potential voltage, the second BTS compensation unit includes a 5-2-th switch TFT switched according to the discharging control signal to connect the second QB node to the input terminal of the low potential voltage, the discharging control signal is selected as the clock having the n+1-th phase among the clocks, and the first BTS compensation unit and the second BTS compensation unit are alternately driven on the cycle of the predetermined period.

6. The gate shift register of claim 5, wherein the first BTS compensation unit further includes a 6-1-th switch TFT switched according to the discharging control signal to connect the first output node to the input terminal of the low potential voltage, and the second BTS compensation unit further includes a 6-2-th switch TFT switched according to the discharging control signal to connect the second output node to the input terminal of the low potential voltage.

7. A gate shift register comprising:

a plurality of stages receiving a plurality of clocks where phases are sequentially shifted to generate gate output signals, wherein an n-th stage of the stages dependently connected to each other includes a first output node outputting an n-th gate output signal of the gate output signals;

a first pull-up TFT switching a current flow between an input terminal of a clock having an n-th phase among the clocks and the first output node according to a potential of a first Q node;

a 1-1-th pull-down TFT switching the current flow between an input terminal of a low potential voltage and the first output node according to a potential of a first QB node charged and discharged differently from the first Q node;

a 1-1-th switch TFT charging the first Q node at a high potential level by connecting an input terminal of a first high potential voltage to the first Q node according to a first start signal having a phase leading a phase of the n-th gate output signal;

a 2-1-th switch TFT discharging the first QB node at a low potential level according to the potential of the first Q node;

a 3-1-th switch TFT discharging the first Q node at the low potential level according to a reset signal having a phase lagging behind the phase of the n-th gate output signal;

a 4-1-th switch TFT discharging the first Q node at the low potential level according to the potential of the first QB node; and a first BTS compensation unit periodically discharging the first QB node at the low potential level just after the n-th stage is reset and just until the n-th stage is set in a next frame, wherein the n-th stage further includes a 1-2-th pull-down TFT switching a current flow between an input terminal of the low potential voltage and the first output node according to the potential of a second QB node alternately driven with the first QB node; and a 4-2-th switch TFT discharging the first Q node at the low potential level according to a potential of the second QB node, an n+1-th stage of the stages includes a second output node outputting an n+1-th gate output signal of the gate output signals;

a second pull-up TFT switching the current flow between an input terminal of a clock having an n+1-th phase among the clocks and the second output node according to a potential of a second Q node;

a 2-1-th pull-down TFT switching the current flow between the input terminal of the low potential voltage and the second output node according to the potential of the first QB node;

a 2-2-th pull-down TFT switching the current flow between the input terminal of the low potential voltage and the second output node according to the potential of the second QB node;

a 1-2-th switch TFT charging the second Q node at the high potential level by connecting the input terminal of the first high potential voltage to the second Q node according to a second start signal having the phase leading the phase of the n+1-th gate output signal and lagging behind the phase of the first start signal;

a 2-2-th switch TFT discharging the second QB node at the low potential level according to the potential of the second Q node;

a 3-2-th switch TFT discharging the second Q node at the low potential level according to the reset signal having the phase lagging behind the phase of the n+1-th gate output signal;

a 4-3-th switch TFT discharging the second Q node at the low potential level according to the potential of the first QB node;

a 4-4-th switch TFT discharging the second Q node at the low potential level according to the potential of the second QB node; and a second BTS compensation unit periodically discharging the second QB node at the low potential level just after the n+1-th stage is reset and just until the n+1-th stage is set in the next frame, the n-th stage and the n+1-th stage share the first QB node with each other and also the second QB node with each other, the first QB node and the second QB node are alternately idly driven on a cycle of a predetermined period, and the idly driven QB node is continuously maintained at the low potential level, wherein the first BTS compensation unit includes a 5-1-th odd switch TFT switched according to a first discharging control signal to connect the first QB node to the input terminal of the low potential voltage, and a 5-2-th odd switch TFT switched according to a second discharging control signal to connect the first QB node to the input terminal of the low potential voltage, the second BTS compensation unit includes a 5-1-th even switch TFT switched according to the first discharging control signal to connect the second QB node to the input terminal of the low potential voltage, and a 5-2-th even switch TFT switched according to the second discharging control signal to connect the second QB node to the input terminal of the low potential voltage, the first discharging control signal is selected as a separate first auxiliary clock overlapping the portion of the clock having the n+1-th phase among the clocks, the second discharging control signal is selected as a separate second auxiliary clock overlapping the remainder of the clock having the n+1-th phase, and the on duty of each of the first and second auxiliary clocks is set to be ½ of the on duty of each of the clocks.

8. The gate shift register of claim 7, wherein the first BTS compensation unit further includes a 6-1-th odd switch TFT switched according to the first discharging control signal to connect the first output node to the input terminal of the low potential voltage, and a 6-2-th odd switch TFT switched according to the second discharging control signal to connect the first output node to the input terminal of the low potential voltage, and the second BTS compensation unit further includes a 6-1-th even switch TFT switched according to the first discharging control signal to connect the second output node to the input terminal of the low potential voltage, and a 6-2-th even switch TFT switched according to the second discharging control signal to connect the second output node to the input terminal of the low potential voltage.

\* \* \* \* \*